United States Patent
Masuda et al.

(10) Patent No.: US 11,002,806 B2
(45) Date of Patent: May 11, 2021

(54) MAGNETIC FIELD DETECTION DEVICE

(71) Applicant: Asahi Kasei Microdevices Corporation, Tokyo (JP)

(72) Inventors: Masanori Masuda, Tokyo (JP); Yoshitaka Moriyasu, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 209 days.

(21) Appl. No.: 16/367,553

(22) Filed: Mar. 28, 2019

(65) Prior Publication Data
US 2019/0302198 A1    Oct. 3, 2019

(30) Foreign Application Priority Data

Mar. 29, 2018 (JP) ............... JP2018-065371
Mar. 29, 2018 (JP) ............... JP2018-065382
Jan. 21, 2019 (JP) ............... JP2019-007783

(51) Int. Cl.
*G01R 33/09* (2006.01)
*G01R 33/02* (2006.01)
*G01R 33/00* (2006.01)

(52) U.S. Cl.
CPC ......... *G01R 33/09* (2013.01); *G01R 33/0017* (2013.01); *G01R 33/0206* (2013.01)

(58) Field of Classification Search
CPC ............. G01R 33/09; G01R 33/0017; G01R 33/0206; G01R 33/00; G01R 33/0035;
(Continued)

(56) References Cited

U.S. PATENT DOCUMENTS

2012/0062215 A1    3/2012  Ide et al.
2012/0062224 A1*   3/2012  Ide .................. G01R 15/205
                                              324/252

(Continued)

FOREIGN PATENT DOCUMENTS

JP    H05232202 A      9/1993
JP    H09199769 A  *   7/1997  ............. G01R 33/09
(Continued)

*Primary Examiner* — Jermele M Hollington
*Assistant Examiner* — Taqi R Nasir
(74) *Attorney, Agent, or Firm* — Kenja IP Law PC

(57) ABSTRACT

Provided is a magnetic field detection device capable of detecting with a higher accuracy. A magnetic field detection device 1 includes a first magnetic sensor unit 1000a, a second magnetic sensor unit 1000b, a third magnetic sensor unit 1000c and a fourth magnetic sensor unit 1000d. The first and the second magnetic sensor units are disposed side by side so that a sensitive axis directions of the first and the second magnetic sensor units are oriented in a first direction, and the third and the fourth magnetic sensor units are disposed side by side so that the sensitive axis directions of the third and the fourth magnetic sensor units are oriented in a second direction. The first and the second magnetic sensor units are disposed between planes each including a center of gravity of each of the third and the fourth magnetic sensor units and defining the second direction as a normal direction, and the third and the fourth magnetic sensor units are disposed between planes each including a center of gravity of each of the first and the second magnetic sensor units and defining the first direction as a normal direction.

15 Claims, 15 Drawing Sheets

(58) Field of Classification Search
CPC ............ G01R 33/0023; G01R 31/3191; G01B 7/004; G01C 17/38; G06F 3/017; G06F 3/0346; G06F 3/012
See application file for complete search history.

(56) References Cited

U.S. PATENT DOCUMENTS

| 2012/0326715 | A1* | 12/2012 | Ide ...................... G01R 15/205 |
| | | | 324/252 |
| 2013/0265039 | A1 | 10/2013 | Cai et al. |
| 2016/0238671 | A1* | 8/2016 | Drouin ............... G01R 33/0082 |

FOREIGN PATENT DOCUMENTS

| JP | H09199769 | A | | 7/1997 | |
| JP | 2005221383 | A | | 8/2005 | |
| JP | 2013105825 | A | | 5/2013 | |
| JP | 2014174061 | A | | 9/2014 | |
| JP | 2014235045 | A | | 12/2014 | |
| JP | 2017003345 | A | * | 1/2017 | ............. G01R 33/10 |
| JP | 2017003345 | A | | 1/2017 | |
| JP | 2017166921 | A | | 9/2017 | |
| WO | 2010143666 | A1 | | 12/2010 | |

* cited by examiner

MAGNETIC FIELD DETECTION DEVICE

TECHNICAL FIELD

This disclosure relates to a magnetic field detection device.

BACKGROUND

Examples of devices for measuring a magnetic field of a body such as a heart or a brain include a biomagnetism measuring device that uses a superconducting quantum interference device (SQUID) sensor. The 2-dimensional magnetic information such as a magnetocardiography and a magnetoencephalography can be obtained by arranging a lot of SQUID sensors for measuring the biomagnetism.

In recent years, a magnetic sensor that can detect an infinitesimally small magnetic field of about tens of pT such as biomagnetism and operates at room temperature has been studied. Examples of magnetic sensors capable of detecting subtle magnetic field include an MR sensor, for example.

A spin valve MR magnetic sensor of MR sensor has a structure in which non-magnetic material is sandwiched between ferromagnetic materials (ferromagnetic material/non-magnetic material/ferromagnetic material). The spin valve MR magnetic sensor generally has a spin valve structure comprising a pinned layer in which magnetization of one of the ferromagnetic material layer is pinned with an antiferromagnetic material layer and a free layer in which magnetization of another ferromagnetic material layer can be rotated freely according to the external magnetic field. When an input magnetic field is applied from the outside, a relative angle between the magnetization of the pinned layer and the magnetization of the free layer is changed, and as a result the current flowing in an intermediate layer, which is a non-magnetic material, is changed. Thus a spin valve MR magnetic sensor can detect the input magnetic field.

A spin valve MR magnetic sensor is known to exhibit a large magnetoresistance (MR) with an infinitesimally small magnetic field, and is mainly used for a hard disc magnetic head and the like. Further, a spin valve MR magnetic sensor is also known to have a high sensitivity compared to a magnetic sensor that uses hall effects (hall element), that is, to be able to detect an infinitesimally small magnetic field.

A closed-loop method is generally known as a magnetic field detection method and is mainly used for a current sensor with core. In the closed-loop method, a feedback current that corresponds to a voltage change of a magnetic sensor generated when an input magnetic field is applied from the outside is fed to a coil, and a canceling magnetic field in the opposite direction of the input magnetic field is applied to an MR sensor with the same strength as the input magnetic field. Thus, ideally, the magnetic field applied to the MR sensor is always constant. In this case, since the feedback current value is proportional to the input magnetic field, the input magnetic field value can be calculated by reading out the feedback current value.

An MR sensor can be operated by a closed-loop method by combining an MR sensor, a coil configured to generate a canceling magnetic field and an electric circuit configured to generate a feedback current. Operation of an MR sensor in closed loop allows a measurable magnetic field range to be dependent on a coil shape design, and as a result the measuring magnetic field range can be designed easily. A compact weak magnetic detection sensor operating at room temperature can be realized by operating an MR sensor in closed loop. When MR sensors are disposed in an array, since each sensor is small, a magnetic field can be detected with a fine space resolution and a fine magnetic field resolution. Thus, this technology finds suitable applications in detecting biomagnetism such as a heart magnetic field and a brain magnetic field and damage and corrosion of metals.

SUMMARY

Technical Problem

However, there is an increased demand for an improved accuracy as a magnetic field detection device. It would therefore be useful to provide a magnetic field detection device having a higher accuracy.

Solution to Problem

A magnetic field detection device according to an embodiment of this disclosure includes a plurality of magnetic sensor units, each having a magnetic sensor that includes a substrate and an element, a canceling magnetic field generator and an electric circuit, and at least a part of the magnetic sensor being located inside an envelope surface of the canceling magnetic field generator. The element outputs a detection value corresponding to an input magnetic field component in a sensitive axis direction. The canceling magnetic field generator is formed by winding a conductor around a direction substantially parallel to the sensitive axis as a winding axis. The electric circuit applies a feedback current based on the detection value to the canceling magnetic field generator to cause the canceling magnetic field generator to generate a canceling magnetic field that reduces the input magnetic field. The magnetic sensor units include at least a first magnetic sensor unit, a second magnetic sensor unit, a third magnetic sensor unit and a fourth magnetic sensor unit. The first magnetic sensor unit and the second magnetic sensor unit are disposed side by side so that the sensitive axis directions of the first magnetic sensor unit and the second magnetic sensor unit are aligned with a first direction. The third magnetic sensor unit and the fourth magnetic sensor unit are disposed side by side so that the sensitive axis directions of the third magnetic sensor unit and the fourth magnetic sensor unit are aligned with a second direction substantially orthogonal to the first direction. The first magnetic sensor unit and the second magnetic sensor unit are disposed between a plane that includes a center of gravity of the third magnetic sensor unit and defines the second direction as a normal direction and a plane that includes a center of gravity of the fourth magnetic sensor unit and defines the second direction as a normal direction. The third magnetic sensor unit and the fourth magnetic sensor unit are disposed between a plane that includes a center of gravity of the first magnetic sensor unit and defines the first direction as a normal direction and a plane that includes a center of gravity of the second magnetic sensor unit and defines the first direction as a normal direction.

Advantageous Effect

According to this disclosure, a magnetic field detection device having a higher accuracy can be provided.

DETAILED DESCRIPTION

Figure 1:
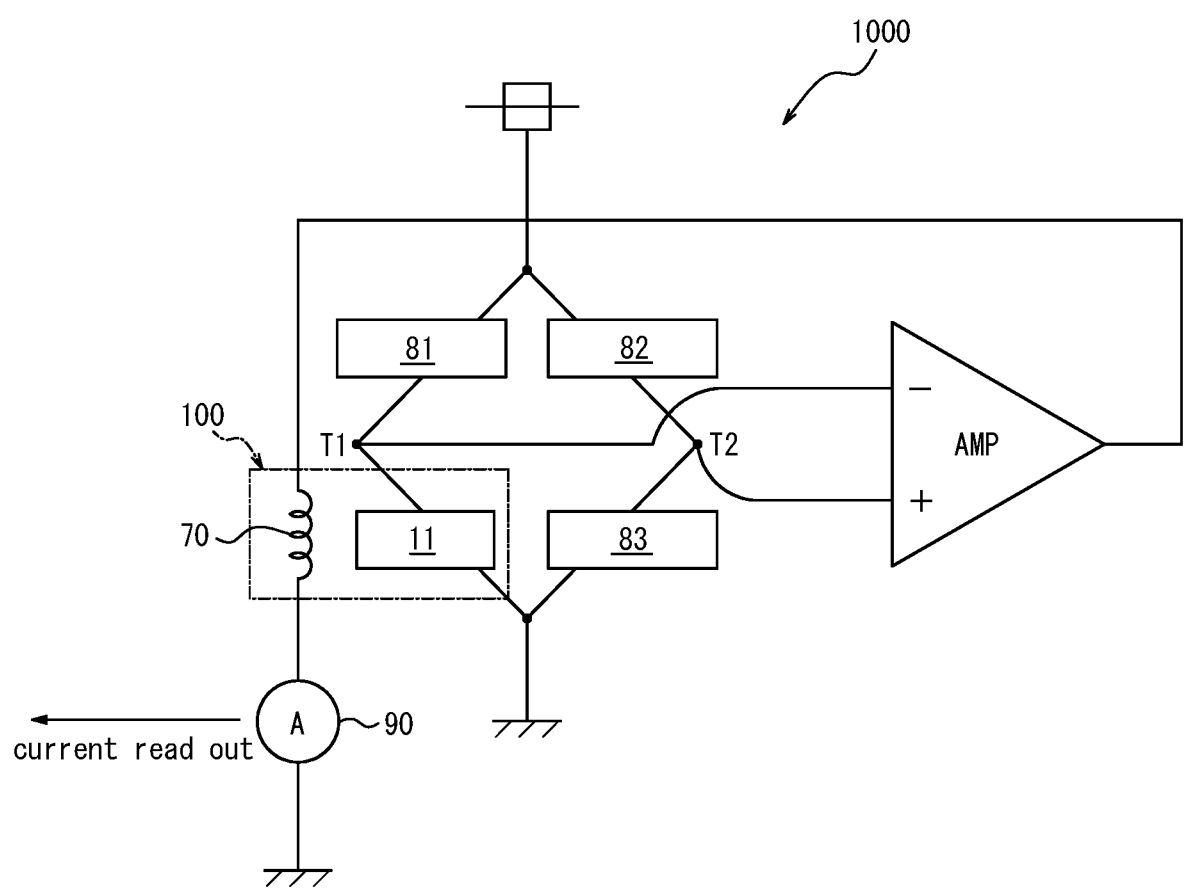
FIG. 1 is a diagram illustrating an example of a magnetic sensor unit including a full-bridge circuit formed by including a magnetic sensor.

The following detailed description provides many specific configurations for complete understanding of the embodiments. However, it is apparent that this disclosure is not limited to the specific configurations, and may be used in other embodiments. The embodiments described below do not limit the invention according to the scope of claims, and include all combinations of characteristic configurations described in the embodiments.

[Description of Each Component]

(Magnetic Sensor Unit)

The magnetic sensor unit includes, for example, a main component and an electric circuit configured to generate a canceling magnetic field. The main component includes, for example, a magnetic sensor and a canceling magnetic field generator. For the purpose of reduction of electrical noise, a method of using a bridge circuit to apply differential input signal to an electric circuit may be used in the magnetic sensor unit. When a bridge circuit is formed, the magnetic sensor unit may use a common fixed resistor or a variable resistor. As described below, in the magnetic sensor unit, at least a part of the element of the magnetic sensor is located inside an envelope surface of the canceling magnetic field generator.

(Magnetic Sensor)

The magnetic sensor is a member having a sensitive area that senses a magnetic field. The resistance value of the sensor varies according to the input magnetic field. The magnetic sensor includes a substrate and an element formed on the substrate. The magnetic sensor also includes a magnetic concentrator configured to concentrate an input magnetic field that is input to the element. The magnetic sensor may further include, for example, a protection layer, an element wiring, an electrode and the like. A plurality of elements may be formed, and each element may be connected by element wiring. Elements of the magnetic sensor are not limited to the aforementioned elements, and other elements may be included. It is to be noted that a canceling magnetic field generator and an electric circuit that generates a cancel current are not included as a component element of the magnetic sensor.

(Substrate)

No specific limitation is placed on a substrate as far as it is made of material that can be insulated from an element. A conductive substrate on which an insulation film is formed may be used as a substrate. Examples of commonly used substrates include a substrate of glass or silicon (Si) on which a $SiO_2$ thermal oxide film is formed.

(Element)

An element is formed on a substrate. The wording of "on" includes not only the case where the element is present on the substrate, but also the case where another layer is further present between the substrate and the element. For other layers, the wording of "on" is also applied in the aforementioned manner. Moreover, the wording of "under" also includes the case where another layer is further present.

Further, the element includes a free layer, a non-magnetic layer and a pinned layer. Preferably, the free layer, the non-magnetic layer and the pinned layer are laminated in this order. However, the order of the layers is not limited. From a viewpoint of improvement of sensitivity, preferably, the non-magnetic layer is formed of an insulating material.

The element has a sensitive axis extending in one direction. The sensitive axis extending in one direction means that the sensitivity to an external magnetic field is maximized in one direction. For example, when the direction of applying the external magnetic field B is inclined at an angle θ relative to the sensitive axis, an effective magnetic field Beff sensed by the magnetic sensor is represented by "B cos θ." When θ=0, that is, when the direction of applying the external magnetic field coincides with the direction of the sensitive axis, the effective magnetic field is maximized, and thus the external magnetic field can be detected with the highest sensitivity. In order to check the sensitive axis, for example, a magnetic field of a certain level of strength enough for sufficient magnetization of a free layer described below is applied, while being rotated, to the magnetic sensor unit, and an angular dependence of a resistance value is measured. The direction of the highest (or the lowest) resistance is the direction of the sensitive axis. In the embodiment described below, the element has a sensitive axis in the direction parallel to a principle surface of the substrate, and outputs a detection value corresponding to the input magnetic field component in the sensitive axis direction. The principal surface of the substrate is a surface that has an area larger than the other surfaces of the substrate.

The element may include another layer on top of, under or in between the three layers (free layer, non-magnetic layer and pinned layer). From a viewpoint of preventing an oxidation, a non-magnetic cap may preferably be provided on top of the element. From a viewpoint of connection with the wiring, the non-magnetic cap layer may preferably be a conductive material such as Au and Ru. Moreover, from a viewpoint of adhesion, a metal layer such as Ti and Ta may preferably be provided between the cap layer and the free layer or the pinned layer.

The element can be formed by a known method, and as an example, the element can be formed by sputtering. Further, when a plurality of elements is formed, the elements can be formed through dry etching or wet etching of a layered film formed on a substrate by using mask patterns formed by a photolithography. In this case, a plurality of elements may be disposed side by side in a direction vertical to the sensitive axis of the magnetic sensor. The shape of the element may be controlled by stopping etching of the element in the middle thereof. In this case, the layer placed above the level of the layer where etching is stopped may be separated into some portions. Etching may be stopped any time. For example, etching may be stopped at the timing of finishing formation of a part of the pinned layer and the non-magnetic layer. From a viewpoint of reduction in element noise, a plurality of elements may preferably be electrically connected. Moreover, the elements may preferably be connected in series.

The position of the pinned layer is not limited. Magnetization distribution in the free layer is changed by the shape of the magnetic concentrator, the shape of the free layer and the positional relationship therebetween. Thus the pinned layer may be disposed on an appropriate position according to the structure. In order to determine a magnetization easy axis of the layered film, a magnetic field may be applied in parallel to the desired direction of the magnetization easy axis during stacked layer formation. The magnetization easy axis means a direction to be magnetized easily due to the magnetic anisotropic property of a magnetic layer. The magnetic anisotropic property is determined by shape magnetic anisotropy determined by a shape of the magnetic layer, magneto crystalline anisotropy determined by crystal orientation, induced magnetic anisotropy caused by arrangement of magnetic atoms, and the like. The magnetization easy axis may also be determined through thermal processing in the magnetic field after formation of a layered film. The magnetization easy axis may also be determined by making a free layer into an elongated shape viewed from the top. The wording of "viewed from the top" means that the substrate is viewed in the direction of stacked three magnetic layers.

With respect to reducing the demagnetizing field and increasing the magnetic sensitivity, an area of the free layer may preferably be larger than that of the pinned layer. The area of the free layer and the area of the pinned layer mean that area of respective layer when viewed from the top. In other words, the area of the free layer and the area of the pinned layer mean area of a surface in parallel to the principal surface of the substrate. When the pinned layer is produced on the free layer, an area of the free layer larger than an area of the pinned layer allows for simpler manufacturing process of the magnetic sensor unit.

(Free Layer)

The free layer is mainly made of a ferromagnetic material that can be easily magnetized by the external magnetic field. The free layer is not limited to those made of single material. The free layer may be multilayer, for example. Examples of ferromagnetic material include NiFe, CoFeB, CoFeSiB, CoFe, NiFeSiB, and the like, but not limited thereto. For improved magnetic sensitivity, the free layer may preferably comprise multilayer including non-magnetic layer such as Ru and Ta.

Regarding the shape of the free layer, in order to increase a magnetic sensitivity and decrease a demagnetizing field, preferably, the length of the layer thickness direction is decreased and the length of the sensitive axis direction is increased. More specifically, the length of the film thickness is preferably 200 nm or less, and more preferably 100 nm or less. The length of the sensitive axis direction is preferably 10 µm or more, more preferably 50 µm or more, and even more preferably 100 µm or more. The length in the direction perpendicular to the sensitive axis and the film thickness may preferably be equal to or longer than the length in the sensitive axis direction such that the continuity of the sensor output signal can be maintained. It is to be noted that the shape of the free layer is not limited to the aforementioned shape.

(Non-Magnetic Layer)

The non-magnetic layer is made of insulating non-magnetic material. In the case of TMR element, insulating materials such as $Al_2O_3$ and MgO are commonly used, but not limited thereto. To improve magnetic sensitivity, MgO may preferably be used for the non-magnetic layer. The non-magnetic layer may have any microfabrication shapes.

(Pinned Layer)

The pinned layer is mainly made of ferromagnetic material so that the direction of magnetization will not easily be changed by the external magnetic field. The pinned layer is not limited to be manufactured with a single material. The pinned layer may be multilayer film. For example, ferromagnetic material pinned with antiferromagnetic materials is used as pinned layer. Examples of soft magnetic materials include NiFe, CoFeB, CoFeSiB, CoFe and the like, but not limited thereto. In order to improve the magnetic sensitivity, the pinned layer may preferably be a multilayer film with non-magnetic layers such as Ru and Ta inserted therebetween. Examples of antiferromagnetic material include IrMn, PtMn and the like, but not limited thereto. The pinned layer may be fabricated in various shapes.

(Sensitive Area)

The magnetic sensor unit detects magnetic field by the change in a resistance value of the magnetic sensor. The resistance value of the magnetic sensor is changed according to the relative angle between the magnetization of the pinned layer and the magnetization of the free layer. That is, the region where a resistance value is changed by magnetic field is defined by the area where the area of the free layer and the area of the pinned layer are overlapped, whichever is smaller viewed from top. Hereinafter the region of the overlapped area defined by the area of the free layer and the area of pinned layer whichever is smaller may be referred to as a sensitive area.

It is to be noted that the maximum value of the length from one end (e.g. the left end) of a sensitive area (if there are some sensitive areas, all of them are included) to the other end (e.g. the right end) in the sensitive axis direction is defined as Lj. In order to reduce an error between the magnetic field of the canceling magnetic field generator and the input magnetic field, Lj may preferably be small. Although spatial ununiformity is inherent in the magnetic field generated by the canceling magnetic field generator described below, when Lj is small, the input magnetic field can be detected as if the input magnetic field was spatially uniformly distributed.

Regarding the electrical noise of the sensor itself, it is known that the electrical noise of the sensor is inversely proportion to the square root of the sensitive area. More specifically, the sensitive area is preferably large. More specifically, the size of the sensitive area may preferably be 100 $\mu m^2$ or more, and more preferably be 1,000 $\mu m^2$ or more.

(Magnetic Concentrator)

The magnetic concentrator is made of soft magnetic material. Examples of soft magnetic material include, but are not limited to NiFe, CoFeSiB, NiFeCuMo, CoZrNb, NiFeNb and the like. Since effective magnetic concentration is possible as the distance between the magnetic concentrator and the element is smaller, a part of the magnetic concentrator may preferably be placed in the vicinity of the element during a micro fabrication process such as sputtering and plating. Additionally, the magnetic concentrator can be realized by combining plural magnetic concentrator parts, such as a magnetic concentrator manufactured by electroplating (a first soft magnetic layer) and a commercially available plate that is made of soft magnetic material and placed away from the element (a second soft magnetic layer). In this case, with respect to effective magnetic concentration, (a film thickness of the free layer, Tfr)<(a film thickness of the magnetic concentrator close to the element, Tfc1)<(a film thickness of the magnetic concentrator away from the element, Tfc2) is preferable. Furthermore, the second soft magnetic layer may be disposed directly in contact with the first soft magnetic layer, or may be disposed with another material (e.g. another thin film) placed therebetween making indirectly in contact therewith. However, with respect to more effective magnetic concentration, the second soft magnetic layer may preferably be directly in contact with the first soft magnetic layer.

In the magnetic sensor, in order to obtain higher sensitivity, as with the aforementioned free layer, the demagnetizing field of the magnetic concentrator in the sensitive axis direction may preferably be small. In order to decrease the unwanted demagnetizing field, the magnetic sensor may preferably be a thin film having a long length in the sensitive axis direction. However, when the thickness of the magnetic concentrator is too thin, although magnetization of the magnetic concentrator itself is increased easily, the spatial magnetization of the free layer is limited, and as a result the magnetic field input to the element is reduced, resulting in the less effective magnetic concentration. Therefore the magnetic concentrator may preferably have a certain thickness. More specifically, the thickness of the magnetic concentrator Tfc may preferably be larger than the thickness of the free layer Tfr. Further, among the magnetic concentrators Tfc, the thickness of the magnetic concentrator Tfc1 located close to the element may preferably be within a range of 1 μm to 500 μm, and when the magnetic concentrator located away from the element is used, the thickness thereof Tfr 2 may preferably be within a range of 100 μm to 10 mm. The values are not limited thereto because the effect of the demagnetizing field varies depending on the length, the width and the shape of the magnetic concentrator. The thickness of the free layer Tfr and the thickness of the magnetic concentrator Tfc may take a plurality of values. The minimum thickness of the free layer Tfr may preferably be smaller than the maximum film thickness of the magnetic concentrator Tfc.

With respect to effective magnetic amplification, the distance between the magnetic concentrator and the free layer, Dfcfr, in the sensitive axis direction may preferably be small. The distance of Dfcfr allowing for effective magnetic amplification varies according to the thickness of the magnetic concentrator Tfc, and may preferably be smaller than the value of the thickness of the magnetic concentrator Tfc. More specifically, Dfcfr<Tfc is preferable. In order to obtain higher sensitivity, the magnetic sensor may preferably formed such that the element is located in the region surrounded by a plurality of magnetic concentrators, viewed from the top. The magnetic concentrator may be overlapped with a part of the element, viewed from the top. When the magnetic concentrator is overlapped with a part of the element, the Dfcfr value may take a negative value. Further, the distance between the magnetic concentrator and the free layer Dfcfr may take a plurality of values. The minimum distance DfcFr may preferably be smaller than five times the film thickness of the magnetic concentrator (Tfc), viewed from the top.

With respect to efficient magnetic amplification, the magnetic concentrator preferably has a shape that satisfies the second length<the third length<the first length. When the first length, the second length and the third length satisfy the aforementioned relation, the demagnetizing field can be reduced further. It is to be noted that the first length is a length connecting both ends of the magnetic concentrator in the sensitive axis direction and the second length is a maximum length of the magnetic concentrator perpendicular to the principal surface of the substrate, and corresponds to the thickness of the aforementioned magnetic concentrator Tfc. Further, the third length is a length connecting both ends of the magnetic concentrator in the direction perpendicular to the sensitive axis direction and the thickness direction of the magnetic concentrator.

The magnetic concentrator may be disposed on both sides of the element in the direction parallel to the sensitive axis. The distance of the magnetic concentrators disposed on both sides of the element in the sensitive axis direction may be smaller than the length of the free layer in the sensitive axis direction.

(Protection Layer)

The protection layer is used to keep insulation of the element, the element wiring, the magnetic concentrator and the like. No specific limitation is placed on the protection layer material as far as it can insulate the element, the element wiring and the magnetic concentrator, and examples of the material include silicon oxide, silicon nitride and aluminum oxide. The protection layer is formed covering overall surface of the element, and a conductive window (i.e. an opening) is present at a joint between the element and the element wiring and above the electrode connecting to the element wiring. No limitation is placed on the position and the shape of the conduction window.

(Element Wiring)

The element wiring connects the electrode and the element through the conduction window formed on the insulation layer. When a plurality of magnetic sensors is connected in serial or in parallel, the element wiring is used to electrically connect the elements one another. With respect to adhesion, a layer such as Ti and Ta may preferably be provided between the cap layer and the element wiring. No limitation is placed on the material of the element wiring as far as it is conductive material capable of electrically connecting elements and electrodes, and examples thereof include Au, Cu, Cr, Ni, Al Ta, Ru and the like. The element wiring may be composed of a single material or of mixture or laminated layers of a plurality of materials. The element wiring may be formed by a known method in which a conductive material is formed by evaporation or sputtering on the entire surface of a mask member formed by a lithography method and an element, and the mask member is stripped by using a stripping solution (i.e. a lift off method), for example.

(Electrode)

An electrode is used for connection when an electric circuit is formed. With respect to adhesion, a layer such as a Ti layer and a Ta layer may preferably be provided between the substrate and the electrode. The element is left on the substrate, and the electrode may be produced thereon. As with the element wiring, no limitation is placed on the electrode material as far as it is a conductive material (e.g. Au, Cu, Cr, Ni, Al, Ta, Ru, and the like), and with respect to property of the element, a material that is difficult to be oxidized (Au, Ru and the like) is preferable. The electrode may be formed of a single material or of a mixed or laminated layer of a plurality of materials. The electrode may be formed by a known method, for example, in which a conductive material is formed by evaporation or sputtering on the entire surface of a mask member formed by a lithography method and an element, and the mask member is stripped by using a stripping solution (i.e. a lift off method). With respect to the number of process steps, the electrode may preferably be produced simultaneously with the element wiring.

(Canceling Magnetic Field Generator)

The canceling magnetic field generator is used to generate a canceling magnetic field for reducing an input magnetic field by applying feedback current to the canceling magnetic field generator based on the magnetic field value (detection value) detected by the magnetic sensor. When a canceling magnetic field is generated, the input magnetic field can be detected by detecting a value of the feedback current applied. The canceling magnetic field is generated such that it cancels the input magnetic field from outside, and as a result, the magnetic field applied to the element will be constant all the time until the maximum feedback current that can be applied to the electric circuit is reached. Therefore, the measurable magnetic field range depends on the shape of the canceling magnetic field generator to which the feedback current is applied and the maximum value of the current that can be applied, and not on the magnetic field saturating the element itself.

Although the magnetic sensitivity of the spin valve MR magnetic sensor traded off with the measurable magnetic field range, the trade off between the magnetic sensitivity and the measurable magnetic field range can be solved by combining the canceling magnetic field generator and the magnetic sensor. The canceling magnetic field generator can be realized, as a solenoid coil or a Helmholtz coil, by winding wires (an example of a conductor) around a non-magnetic material. As a non-magnetic material, metal such as Al and resin material can be used. In the embodiment described later, the canceling magnetic field generator is formed by winding a conductor into a form of a coil around a winding axis, which is a direction substantially parallel to the sensitive axis.

As is already known, a conversion factor between the current and the magnetic field can be determined by adjusting the number of windings of the wire. No specific limitation is placed on the shape of non-magnetic material as far as the wire is wound uniformly. If electrically insulated, it is not required to use a non-magnetic material and wire may directly be wound around the magnetic sensor. The canceling magnetic field generator may be produced near the magnetic sensor by sputtering, frame plating and the like as far as it is insulated from the magnetic sensor through the insulation protection layer and the like. No limitation is placed on the cross-sectional shape of the canceling magnetic field generator formed by winding as far as a magnetic sensor can be disposed therein. With respect to easiness of production, it may preferably have a circular, oval or polygonal shape.

In the case of a common solenoid coil, for example, the magnetic field generated by the canceling magnetic field generator has a spatial distribution in which the magnetic field is the highest at the center and becomes weaker toward the edge. Although it is ideal if the feedback magnetic field coincides with the input magnetic field, there is in reality a spatial distribution of the magnetic field as described above.

In order to improve the linearity by approximating the distribution of the feedback magnetic field to the distribution of the input magnetic field as much as possible, preferably, magnetic is detected in a micro region where the feedback magnetic field is considered to be almost constant. Thus, the center of gravity of the sensitive area and at least a part of the magnetic concentrator disposed on both sides of the element may preferably be disposed inside the envelope surface of the canceling magnetic field generator. It is to be noted that the envelope surface of the canceling magnetic field generator means a virtual 3D structure formed by connecting the outer shape of the canceling magnetic field generator. For example, when the canceling magnetic field generator is formed by winding a conductor into a coil shape, the envelope surface includes a cylindrical surface forming a cylinder configured by connecting a coiled conductor. In this example, when a coil-shaped conductor is physically separated into some parts, the envelope surface may be formed such that it envelopes a plurality of coil-shaped conductors.

The length of the sensitive area in the winding axis direction may preferably be smaller than the length of the canceling magnetic field generator in the winding axis direction. If the sensitive areas are symmetrically disposed with respect to the central axis of the canceling magnetic field generator, it is not necessary for all of the sensitive areas to be located inside the envelope surface of the canceling magnetic field generator. However, regarding the improved linearity, all of the sensitive areas may preferably be located inside the envelope surface of the canceling magnetic field generator. Further, in order to decrease the entire size, the magnetic sensor may preferably be covered with the canceling magnetic field generator.

The maximum length of the sensitive area in the sensitive axis direction, Lj, may preferably be sufficiently small with respect to the length of the canceling magnetic field generator in the sensitive axis direction, Lc. More specifically, Lc/Lj>5 is preferable, Lc/Lj>50 is more preferable, and Lc/Lj>100 is even more preferable.

Since the ununiformity of the magnetic field generated by the canceling magnetic field generator is the smallest near the center of gravity of the canceling magnetic field generator, in order to decrease the magnetic field distribution in the sensitive area so that improved linearity can be obtained, the position of the center of gravity of the sensitive area may preferably be coincident with the position of the center of gravity of the canceling magnetic field generator. It is to be noted that, when there is a plurality of sensitive areas, the position of the center of gravity of the sensitive area is the center of gravity of all of the sensitive areas. Further, it is not necessary for the position of the center of gravity of the sensitive area and the position of the center of gravity of the canceling magnetic field generator to completely coincide with each other, and these positions may substantially coincide with each other. The ideal misalignment between these centers of gravity is one tenth or less of the length of the canceling magnetic field generator in the sensitive axis direction, for example, but it is not limited thereto. In the present embodiment, the center of gravity of the canceling magnetic field generator is defined as the "center of gravity of the magnetic sensor unit."

(Electric Circuit)

The electric circuit causes the canceling magnetic field generator to generate a canceling magnetic field that reduces the input magnetic field by applying the feedback current based on a detection value corresponding to an input magnetic field component to the canceling magnetic field generator. The electric circuit may include a conventional operational amplifier. For example, when output of the operational amplifier is connected to the canceling magnetic field generator such that a magnetic field opposite to the input magnetic field is generated, the magnetic field detected by the magnetic sensor is reduced, and a balanced operation is achieved. The electric circuit may be realized by using two or more operational amplifiers.

In order to reduce electromagnetic noise, signal may preferably be amplified by using an operational amplifier after decreasing the length of the wiring from the magnetic sensor to the electric circuit and applying an electromagnetic shield to the wiring. A low-pass filter may be used to decrease high-frequency noise. A high-pass filter may be used to cut off DC noise. As a current detector, it is easy and simple to dispose a resistor in the current path to measure voltages on both ends of the resistor.

(Resistor)

As a resistor, a common metal film resistor or a chip resistor may be used. With respect to size reduction, use of a chip resistor is preferable. A variable resistor may also be used. A digital potentiometer capable of controlling a variable resistance value based on an input value may be used. Whichever resistor is used, a resistor with a small circuit noise is preferable.

(Magnetic Field Detection Device)

The magnetic field detection device includes a plurality of magnetic sensor units. As aforementioned, the magnetic sensor unit has a magnetic sensor including a substrate and an element, a canceling magnetic field generator and an electric circuit. Configuration of a magnetic field detection device according to some embodiments may be described below with reference to drawings.

Embodiment 1

(Configuration of Magnetic Sensor unit and Production Method Thereof)

Figure 2:
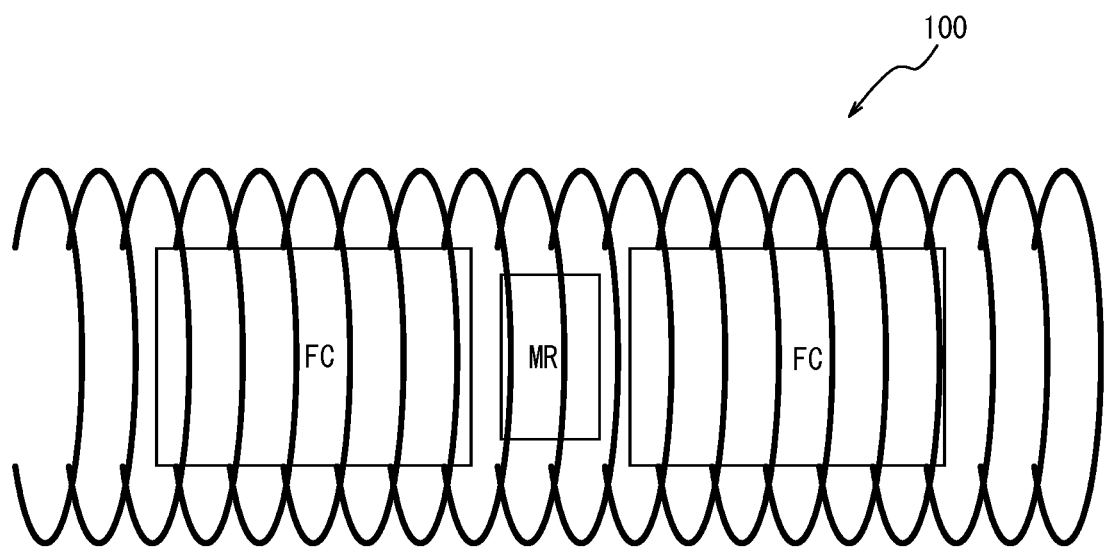
FIG. 2 is a diagram illustrating an example of a main component.

FIG. 1 is a schematic diagram illustrating an example of a magnetic sensor unit 1000 provided in a magnetic field detection device according to Embodiment 1. The magnetic sensor unit 1000 includes a bridge circuit composed of a magnetic sensor 11 and resistors 81 to 83. FIG. 2 is a schematic diagram illustrating an example of a main component 100 of the magnetic sensor unit 1000. In the present embodiment, the main component 100 includes the magnetic sensor 11 and a canceling magnetic field generator 70. An MR in FIG. 2 schematically illustrates an element of the magnetic sensor 11. Further, each FC in FIG. 2 schematically illustrates a magnetic concentrator of the magnetic sensor 11. A coil portion in FIG. 2 schematically illustrates the canceling magnetic field generator 70.

In the bridge circuit of the magnetic sensor unit 1000, a positive side (+) of power source, a resistor 81, the magnetic sensor 11 and a negative side (−) of power source are connected in this order. Further, in the bridge circuit, a positive side (+) of power source, a resistor 82, a resistor 83 and a negative side (−) of power source are connected in this order. As illustrated in FIG. 1, the bridge circuit is formed of a resistor group having a terminal T1 at a connection point between the resistor 81 and the magnetic sensor 11 and a resistor group having a terminal T2 at a connection point between the resistor 82 and the resistor 83, these groups being connected in parallel.

A signal of the terminal T1 and a signal of the terminal T2 are input to an operational amplifier AMP as an electric circuit. An output of the operational amplifier AMP is connected to one end of the canceling magnetic field generator 70. The other end of the canceling magnetic field generator 70 is grounded through a current detector 90.

With the aforementioned configuration, the magnetic sensor unit 1000 supplies a signal from the bridge circuit including the magnetic sensor 11 to the canceling magnetic field generator 70 through the electric circuit including the operational amplifier AMP. The magnetic sensor unit 1000 detects the strength of the input magnetic field by reading out the detected current of the current detector 90 as a current value corresponding to the amount of the magnetic field applied to the magnetic sensor 11.

Figure 3:
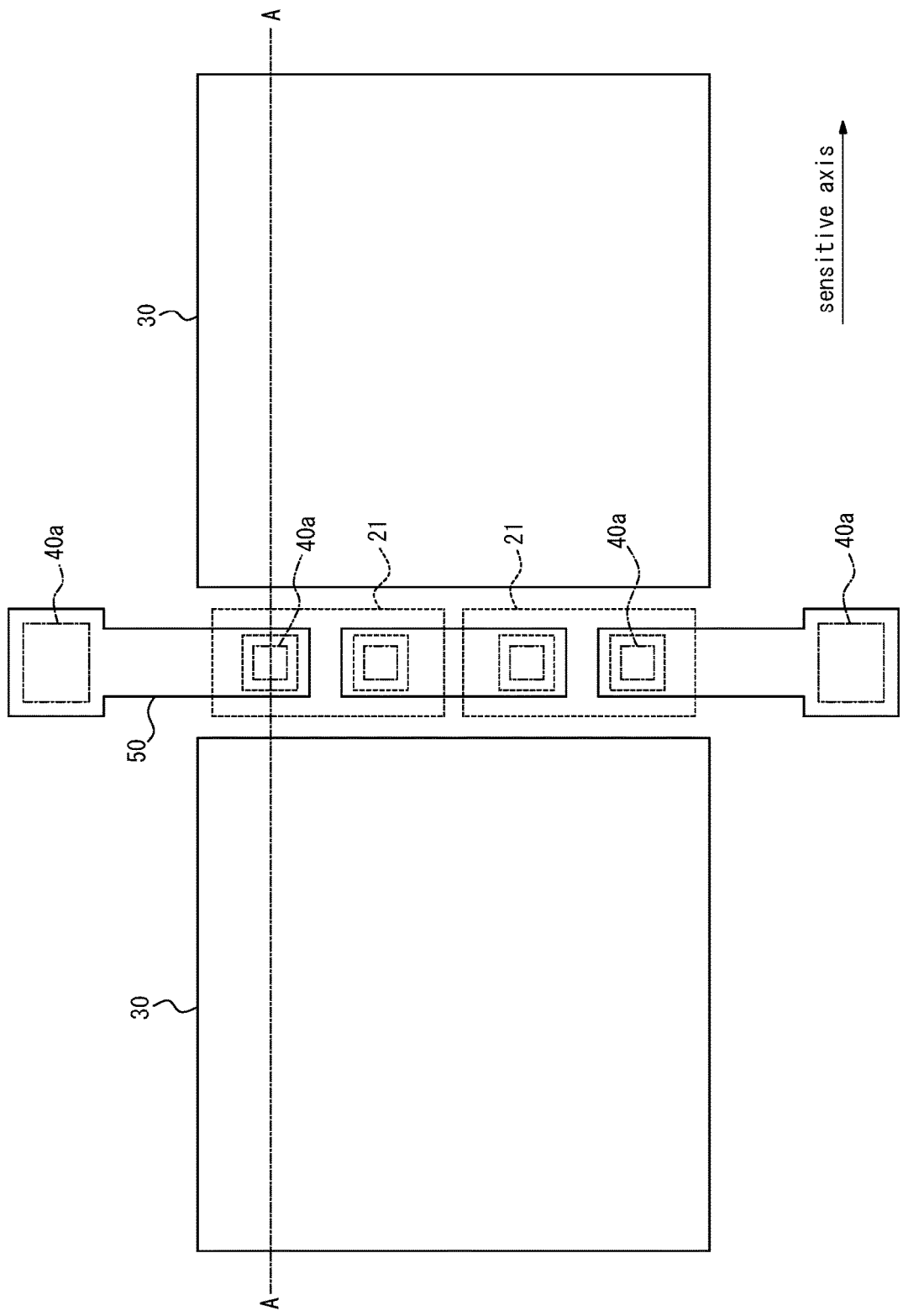
FIG. 3 is a schematic top view illustrating an example of the magnetic sensor.
Figure 4:
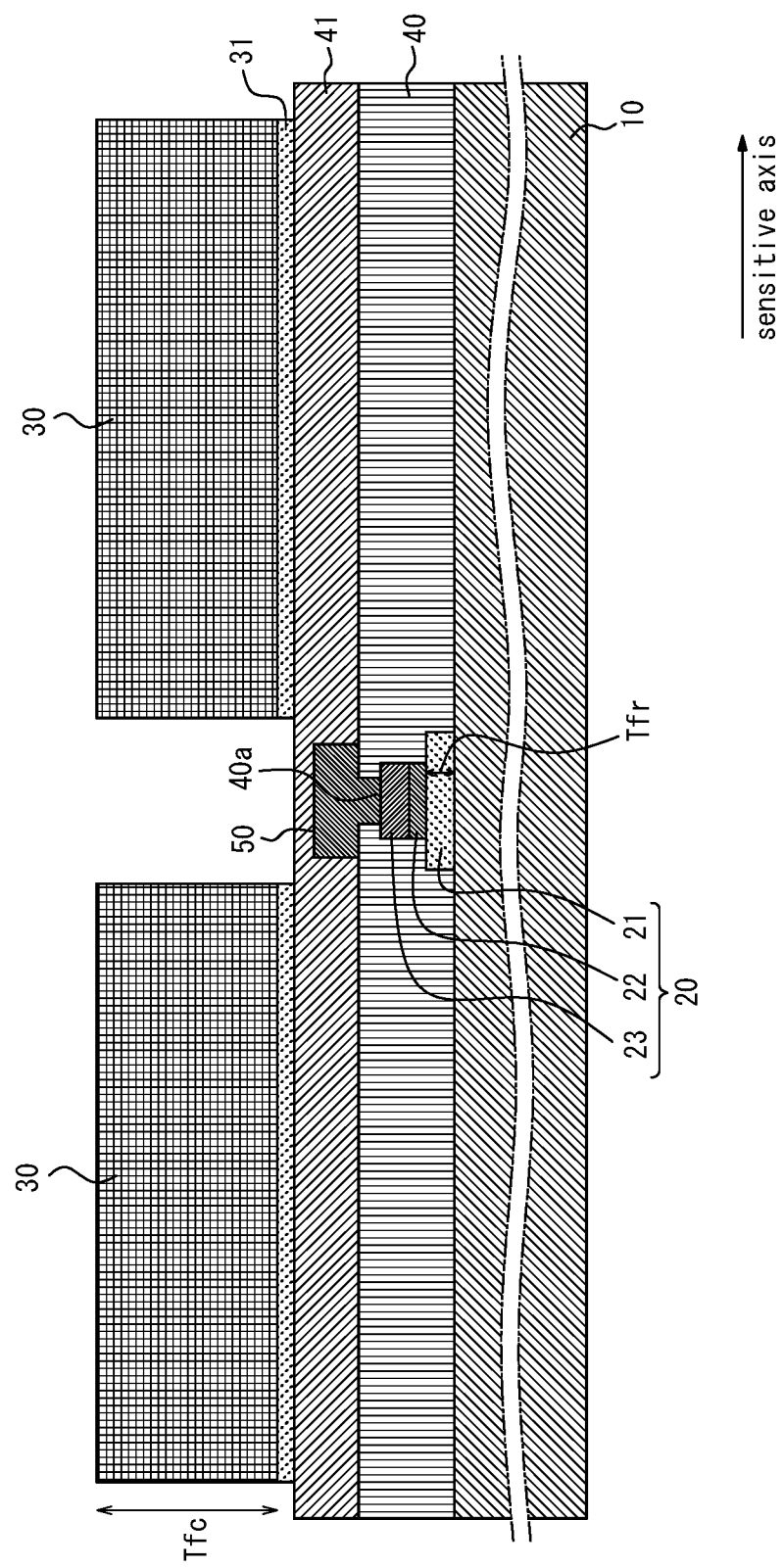
FIG. 4 is a schematic cross-section view of the magnetic sensor illustrated in FIG. 3.

FIG. 3 is a schematic diagram illustrating an example of the magnetic sensor 11 viewed from the top. FIG. 4 is a schematic diagram illustrating A-A cross section in FIG. 3. FIG. 3 illustrates some parts of the magnetic sensor 11. For example, FIG. 3 does not illustrate a substrate 10 and a protection layer.

As illustrated in FIGS. 3 and 4, the magnetic sensor 11 includes the substrate 10, an element 20 disposed on the substrate 10, a protection layer 40 covering the element 20, an element wiring 50 connected to the element 20 through a conduction window 40a formed on the protection layer 40, and a protection layer 41 covering the element wiring 50 and the protection layer 40. The magnetic sensor 11 further includes a magnetic concentrator 30 disposed on the protection layer 41 through a seed layer 31.

Viewed from the top, the element 20 and the magnetic concentrator 30 are disposed side by side along a sensitive axis.

In the element 20, the free layer 21, the non-magnetic layer 22 and the pinned layer 23 are layered in this order. More specifically, a plurality of layered bodies each formed of a non-magnetic layer 22 and a pinned layer 23 is formed on single free layer 21. The layered bodies are disposed along a line substantially orthogonal to one direction (the sensitive axis direction of the element 20) of sides defining a magnetic concentrator 30. In FIG. 3, two layered bodies formed of the non-magnetic layer 22 and the pinned layer 23 are disposed on single free layer 21.

Figure 5:
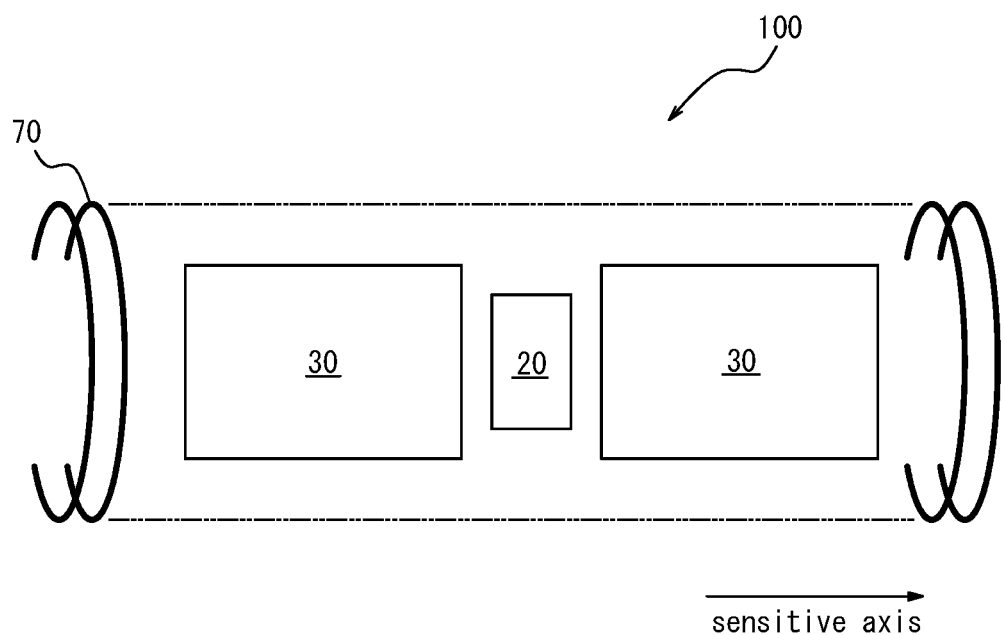
FIG. 5 is a diagram illustrating the main component.

FIG. 5 is a diagram that illustrates a configuration of the main component 100. Apart from the magnetic sensor 11, a canceling magnetic field generator 70 formed by winding wires around a non-magnetic material is provided. As illustrated in FIG. 5, the magnetic sensor 11 is included in the canceling magnetic field generator 70, and the main component 100 is configured by combining such that the sensitive axis direction of the magnetic sensor 11 is substantially parallel to the winding axis of the canceling magnetic field generator 70.

Figure 6:
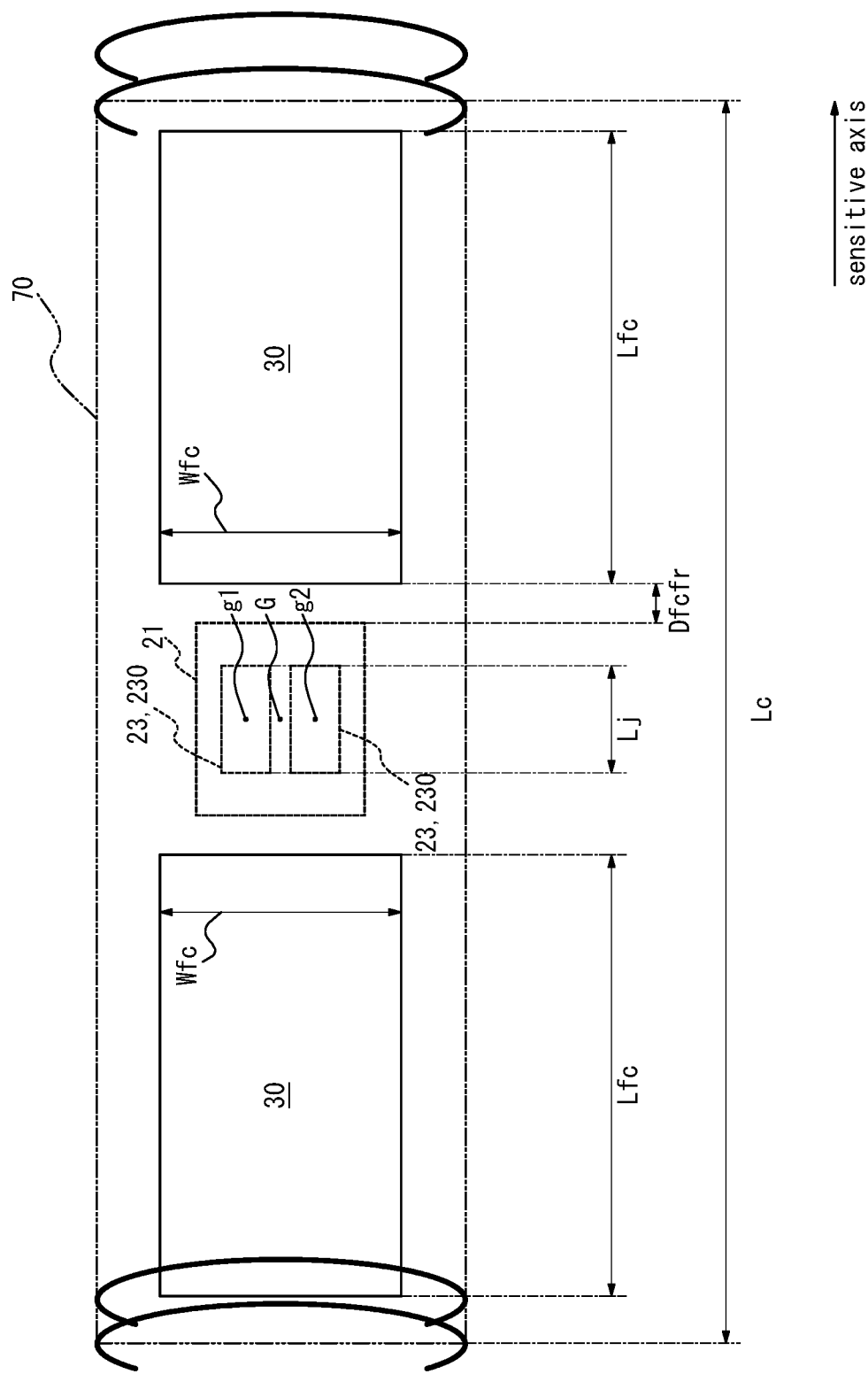
FIG. 6 is a diagram illustrating a length of a magnetic concentrator.

It is to be noted that FIG. 6 is a diagram that illustrates a length of the magnetic concentrator 30 and is a top schematic view illustrating another example of the magnetic sensor 11. In the example of FIG. 6, the free layer 21 and two sensitive areas 230 are illustrated. In the example of FIG. 6, the area of the pinned layer 23 is smaller than the free layer 21, and thus the sensitive area 230 is defined by the area of the pinned layer 23. Each magnetic concentrator 30 is disposed on both sides of the element that includes the free layer 21 and the pinned layer 23 in the direction parallel to the sensitive axis. The shape and the size of the two magnetic concentrators 30 disposed on both sides are the same. Each magnetic concentrator 30 has a first length Lfc, which is a length connecting both ends of the magnetic concentrator in the sensitive axis direction. Further, as illustrated in FIG. 4, each magnetic concentrator 30 has a second length, which is a maximum length in the direction perpendicular to the principal surface of the substrate 10. The second length corresponds to the thickness of the magnetic concentrator 30, Tfc. The magnetic concentrator 30 also has a third length Wfc, which is a length (width) connecting both ends in a direction perpendicular to the sensitive axis direction and the direction perpendicular to the principal surface of the substrate 10. In the present embodiment, the magnetic concentrator 30 satisfies the second length (thickness Tfc)<the third length Wfc<the first length Lfc.

Further, in the example illustrated in FIG. 6, two sensitive areas 230 have respectively the center of gravity g1 and the center of gravity g2. In this case, the position of the center of gravity of the magnetic sensor unit 1000 is the center of gravity G of all of the sensitive areas 230. In the present embodiment, the position of the center of gravity of all of the sensitive areas 230 is coincide with the position of the center of gravity of the canceling magnetic field generator 70. In other words, the position of the center of gravity of the canceling magnetic field generator 70 is the center of gravity G.

The main component 100 can be produced by the production method described below, for example. First, a layered film formed of a ferromagnetic layer and a non-magnetic layer is formed on the substrate 10 by a known method such as sputtering. Subsequently a mask member is formed on the laminated film by photolithography and the like. The mask member can be formed on a desired position of the layered film into a desired shape.

Subsequently a part on the layered film not covered by the mask member is etched by a known method such as ion milling and the like. As a result, the layered film on the substrate 10 is formed into a desired flat shape. It is to be noted that a plurality of layered films (layered portion) formed into a desired flat shape may be provided within the surface of the substrate 10

Subsequently a mask member is formed on the layered portion by photolithography and the like. At this time, an opening of the mask member is formed such that it is smaller than a plane area of the layered portion. Subsequently the layered portion not covered by the mask member is etched by a known method such as ion milling. In this case, in the structure of "ferromagnetic layer/non-magnetic layer/ferromagnetic layer" in the layered film, etching is stopped near the non-magnetic layer. In this case, a part of the ferromagnetic layer on the lower side may be etched. Thus, a dimension in one direction of non-magnetic layer/ferromagnetic layer not in contact with the substrate 10 is formed smaller than the ferromagnetic layer in contact with the substrate 10. As a result of this, the element 20 formed of the free layer 21 of a ferromagnetic layer, the non-magnetic layer 22 and the pinned layer 23 of a ferromagnetic layer is formed on the substrate 10.

Subsequently an insulating film is formed on the element 20 by a known method such as chemical vapor deposition (CVD). A mask member is formed on the insulating film by photolithography and the like. Furthermore an opening for a conduction window 40a is formed by etching of the insulating film by a known method such as reactive ion etching (RIE). As a result, a protection layer 40 having a conduction window 40a is formed.

Subsequently a mask member is formed on the protection layer 40 by photolithography and the like. Furthermore, a metal thin film is formed by a known method such as sputtering. An element wiring 50 is formed by removing a mask member and a metal thin film on the mask member.

Furthermore, a protection layer 41 is formed by a known method such as sputtering to remove insulation between the magnetic concentrator 30 and the seed layer 31.

Further, the seed layer 31, that is a base for plating, is formed by a known method such as sputtering.

Moreover, a mask member is formed on the seed layer 31 by photolithography and the like. Subsequently a plating film is formed on the opening of the mask member by a known method such as electroplating, and after the magnetic concentrator 30 is formed, the mask member is removed. Subsequently the seed layer 31 and the protection layer 40 (except for the part located between the magnetic concentrator 30 and the protection layer 40) covering all over the surface are removed by a known method such as ion milling.

The magnetic sensor 11 illustrated in FIGS. 3 and 4 can be realized by the aforementioned process, and as described above, the main component 100 can be obtained by combining the magnetic sensor 11 and the canceling magnetic field generator 70. The main component 100 configured in the aforementioned manner forms a bridge circuit as illustrated in FIG. 1 and is combined with an electric circuit such as an operational amplifier, and as a result the magnetic sensor unit 1000 is formed.

(Configuration of Magnetic Field Detection Device and Production Method Thereof)

Figure 7:
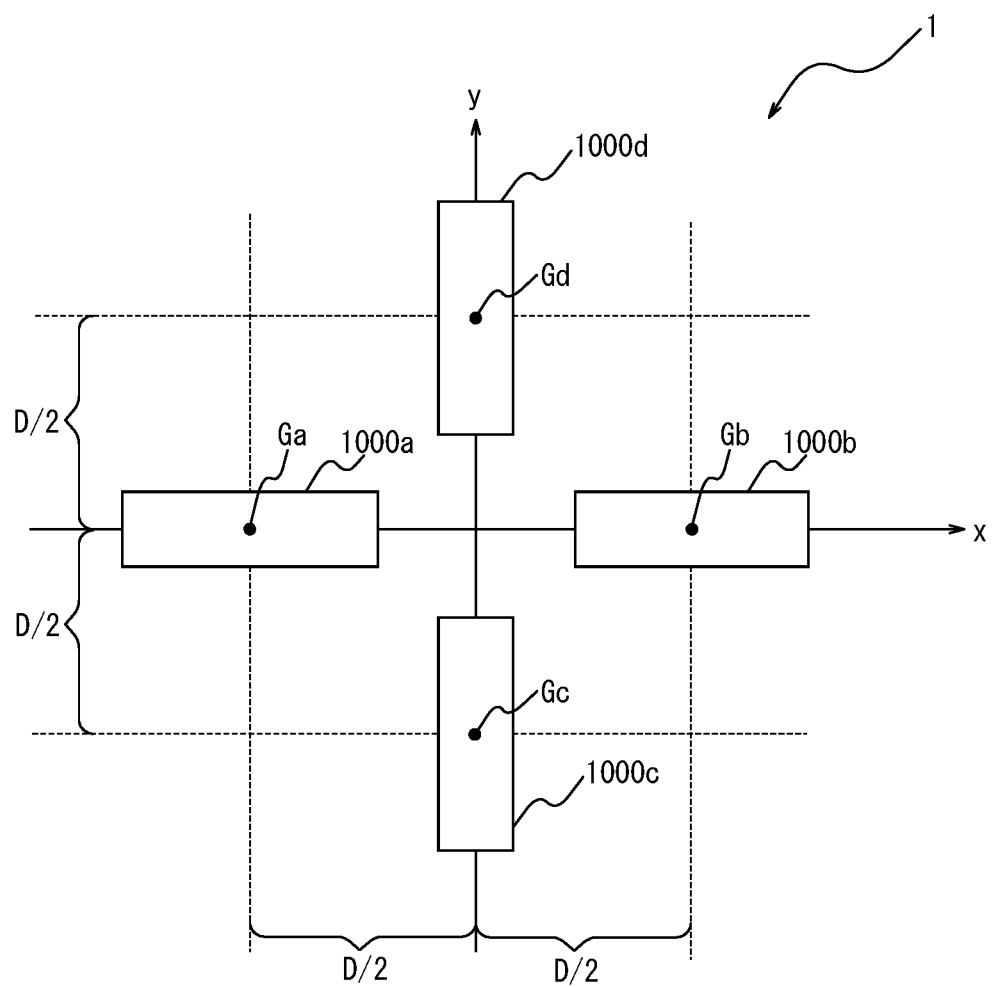
FIG. 7 is a diagram illustrating a configuration of a magnetic field detection device.

FIG. 7 is a diagram illustrating a configuration example of a magnetic field detection device 1 according to the present embodiment. The magnetic field detection device 1 includes a plurality of magnetic sensor units 1000. In the present embodiment, the magnetic field detection device 1 includes a first magnetic sensor unit 1000a, a second magnetic sensor unit 1000b, a third magnetic sensor unit 1000c and a fourth magnetic sensor unit 1000d.

The first magnetic sensor unit 1000a and the second magnetic sensor unit 1000b are disposed side by side so that the sensitive axis directions of the first magnetic sensor unit 1000a and the second magnetic sensor unit 1000b are aligned with a first direction. It is to be noted that the first magnetic sensor unit 1000a and the second magnetic sensor unit 1000b may be disposed at specific intervals. Components other than the magnetic sensor unit such as a print board and a magnetic layer may be present between the first magnetic sensor unit 1000a and the second magnetic sensor unit 1000b. In the example illustrated in FIG. 7, the first direction is the x-axis direction. The third magnetic sensor unit 1000c and the fourth magnetic sensor unit 1000d are disposed side by side so that the sensitive axis direction of the third magnetic sensor unit 1000c and the fourth magnetic sensor unit 1000d are aligned with a second direction. In the example illustrated in FIG. 7, the second direction is the y-axis direction. In the example illustrated in FIG. 7, the first direction (x-axis direction) and the second direction (y-axis direction) are orthogonal to each other. It is to be noted that the first direction and the second direction are not strictly orthogonal to each other. In other words, the first direction and the second direction are substantially orthogonal to each other.

As illustrated in FIG. 7, the first magnetic sensor unit 1000a has a center of gravity Ga. The second magnetic sensor unit 1000b has a center of gravity Gb. The third magnetic sensor unit 1000c has a center of gravity Gc. The fourth magnetic sensor unit 1000d has a center of gravity Gd. In the example in FIG. 7, the coordinate of the center of gravity Ga is represented by ((−D/2), 0), the coordinate of the center of gravity Gb is represented by ((+D/2), 0), the coordinate of the center of gravity Gc is represented by (0, (−D/2), and the coordinate of the center of gravity Gd is represented by (0, (+D/2)). The magnetic sensor units 1000 disposed side by side in the x-axis direction are separated by the distance D in the x-axis direction, and the magnetic sensor units 1000 disposed side by side in the y-axis direction are separated by the distance D in the y-axis direction. For example, the distance D is 20 mm.

When a plurality of magnetic sensors each of which are composed of MR sensor and coil are disposed close to each other, the magnetic flux generated by the coil forms a loop shape. Thus, in addition to the input magnetic field from outside, the magnetic field generated by the other magnetic sensor disposed closely to a certain magnetic sensor is mixed, and as a result, signal crosstalk occurs between magnetic sensors. The signal crosstalk means that a part of signal component of a certain magnetic sensor is mixed into a signal of the other magnetic sensor. For example, when magnetic sensors of different sensitive directions are disposed close to each other, crosstalk from the other magnetic sensor of the other axis that is not the sensitive direction for a certain sensor occurs, and as a result accurate signal component may not be obtained.

Figure 8:
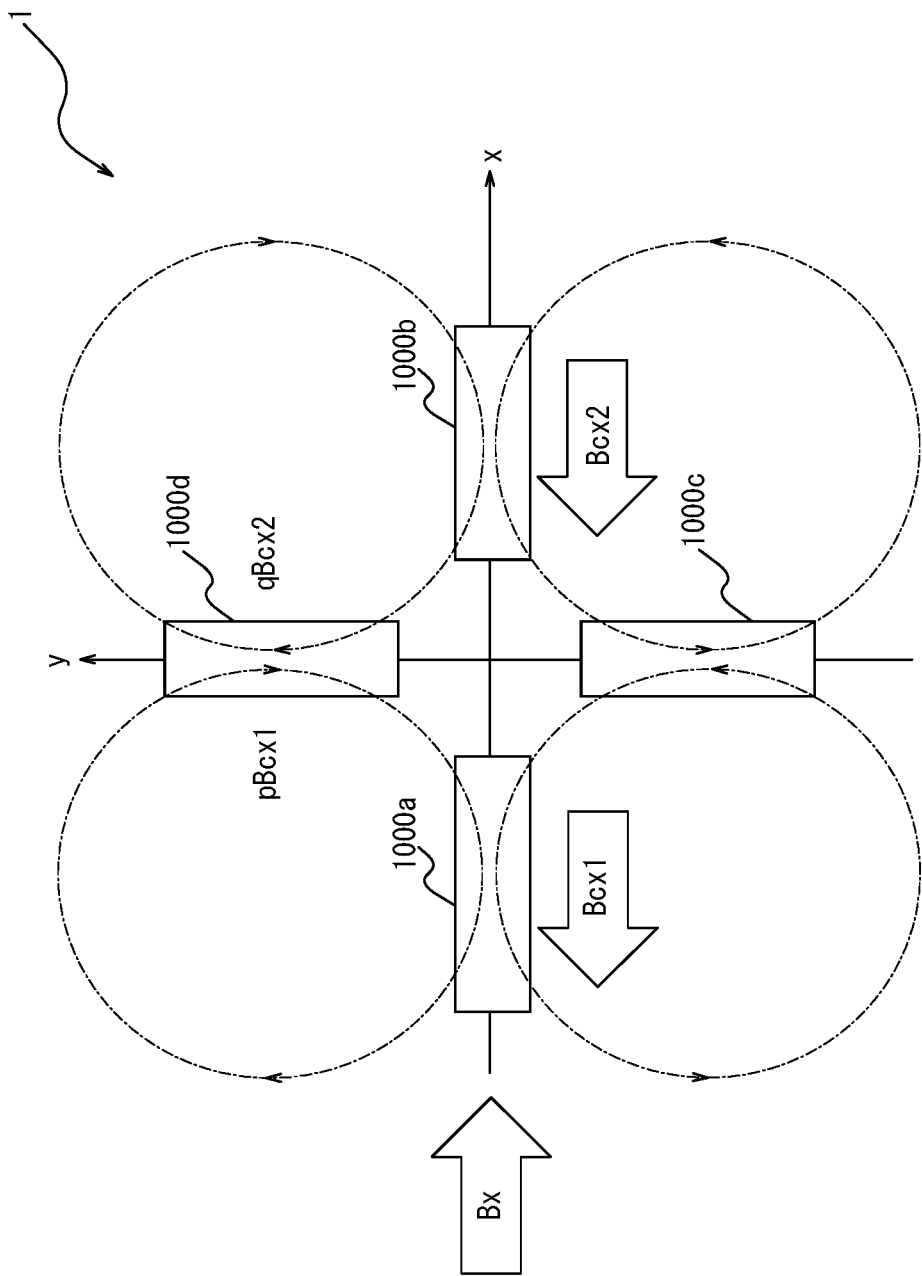
FIG. 8 is a diagram illustrating a state where a magnetic field is applied by the magnetic field detection device in FIG. 7.

FIG. 8 illustrates a state where a magnetic field is applied by the magnetic field detection device 1 illustrated in FIG. 7. In the example in FIG. 8, an input magnetic field from outside, Bx (hereinafter referred to as an external magnetic field Bx), is applied to the magnetic field detection device 1 in the positive x-axis direction. The closed-loop type first magnetic sensor unit 1000*a* applies feedback current to the canceling magnetic field generator 70 to detect the external magnetic field Bx. At this time, the first magnetic sensor unit 1000*a* generates a magnetic field Bcx1 by the feedback current. The magnetic field Bcx1 has a positional dependence in which the strength varies according to the distance from the first magnetic sensor unit 1000*a*. For example, at the position of the fourth magnetic sensor unit 1000*d*, the generated magnetic field Bcx1 gives an affect with the strength of pBcx1 where p is a coefficient that indicates a positional dependence. In the fourth magnetic sensor unit 1000*d*, crosstalk can occur by the magnetic field Bcx1 generated by the first magnetic sensor unit 1000*a* of the other axis (a different sensitive axis).

In the example illustrated in FIG. 8, the closed loop type second magnetic sensor unit 1000*b* applies feedback current to the canceling magnetic field generator 70 to detect the external magnetic field Bx. In this case, the second magnetic sensor unit 1000*b* generates the magnetic field Bcx2 by the feedback current. For example, at the position of the fourth magnetic sensor unit 1000*d*, the generated magnetic field Bcx2 gives an affect with the strength of qBcx2 where q is a coefficient that indicates a positional dependence. In the fourth magnetic sensor unit 1000*d*, crosstalk can occur by the magnetic field Bcx2 generated from the second magnetic sensor unit 1000*a* of the other axis (a different sensitive axis).

It is to be noted that the first magnetic sensor unit 1000*a* and the second magnetic sensor unit 1000*b* have the same configuration. Further, both the first magnetic sensor unit 1000*a* and the second magnetic sensor unit 1000*b* generate a magnetic field by the feedback current to cancel the external magnetic field Bx. That is, Bx=−Bcx1=−Bcx2 holds for the sensitive axis direction (x-axis direction) of the first magnetic sensor unit 1000*a* and the second magnetic sensor unit 1000*b*.

Further, the first magnetic sensor unit 1000*a* and the second magnetic sensor unit 1000*b* are disposed linearly symmetrical relative to the y-axis where the fourth magnetic sensor unit 1000*d* is located. Thus p=−q holds for the aforementioned coefficients p and q.

Therefore, at the position of the fourth magnetic sensor unit 1000*d*, the magnetic field Bcx1 generated by the first magnetic sensor unit 1000*a* is cancelled by the magnetic field Bcx2 generated by the second magnetic sensor unit 1000*b*. In the same manner, at the positions of the first magnetic sensor unit 1000*a*, the second magnetic sensor unit 1000*b* and the third magnetic sensor unit 1000*c*, the influence of the magnetic field generated by the magnetic sensor unit 1000 of the other axis (a different sensitive axis) is cancelled.

It should be noted that the magnetic field Bcx1 and the magnetic field Bcx2 may not completely coincide due to individual difference caused by manufacture or error in the position, for example. Also in this case, the magnetic field Bcx1 and the magnetic field Bcx2 are at least partially cancelled at the position of the fourth magnetic sensor unit 1000*d*, and thus the signal crosstalk is reduced. The difference between the magnetic field Bcx1 and the magnetic field Bcx2 due to the individual difference caused by manufacture is strongly affected by the offset component of the feedback current. In order to reduce the crosstalk more effectively, the electric circuit of each magnetic sensor unit 1000 may preferably have a function of adjusting an offset value of the feedback current. For example, an electric circuit of each magnetic sensor unit 1000 may include a circuit by which the feedback current is increased or decreased by the amount according to the offset value. When an electric circuit of each magnetic sensor unit 1000 sets an appropriate offset value, it is possible to offset the magnetic field generated by the magnetic sensor unit 1000 of the other axis even if individual difference is present. The offset value is determined by a voltage difference between Ta and Tb of the bridge circuit illustrated in FIG. 1. In order to reduce the voltage difference between Ta and Tb, for example, the difference between outputs of Ta and Tb in the background of measuring environment is stored in an external memory and the like, and on the basis of the stored values, a resistance value of a digital potentiometer attached as one of resistors may be set.

In the magnetic field detection device 1 according to the present embodiment, if the influence of the magnetic field generated by the magnetic sensor unit 1000 of the other axis (a different sensitive axis) is cancelled, the position of the magnetic sensor unit 1000 may be different from that illustrated in FIG. 7. In the example in FIG. 7, a plurality of magnetic sensor units 1000 in the same sensitive axis direction are disposed side by side on one axis parallel to the sensitive axis direction. That is, the magnetic sensor units 1000 are disposed along the x-axis or the y-axis. It is to be noted that it is not necessary for the center of gravity G of the magnetic sensor unit 1000 to be located on the x-axis or the y-axis, and it may be displaced by a distance Δd. The distance Δd is set smaller than the distance between the magnetic sensor units 1000. For example, the distance Δd is D/2 or less. The distance Δd is preferably D/4 or less, more preferably D/8 or less, and even more preferably D/16 or less. The direction of displacement may be either along the x-axis or along the y-axis direction, or may not be. When the intersection point between the x-axis and the y-axis is (0, 0), the coordinate of the center of gravity Ga is ((−D/2)±Δd, ±Δd), the coordinate of the center of gravity Gb is ((+D/2) ±Δd, ±Δd), the coordinate of the center of gravity Gc is (±Δd, (−D/2)±Δd) and the coordinate of the center of gravity Gd is (±Δd, (+D/2)±Δd). In the example in FIG. 7, the distance Δd is 0.

That is, the magnetic field detection device 1 according to the present embodiment has the following positional relationship in a plane (e.t. xy plane) including the first direction (e.g. the x-axis direction) and the second direction (e.g. the y-axis direction). The first magnetic sensor unit 1000*a* and the second magnetic sensor unit 1000*b* are disposed between the center of gravity of the third magnetic sensor unit 1000*c* and the center of gravity of the fourth magnetic sensor unit 1000*d* in the second direction. That is, when the center of gravities of the first to fourth magnetic sensor units are projected in the second direction, the center of gravity of the first magnetic sensor unit 1000*a* and the center of gravity of the second magnetic sensor unit 1000*b* are located between the center of gravity of the third magnetic sensor unit 1000*c* and the center of gravity of the fourth magnetic sensor unit 1000*d*. Further, the first magnetic sensor unit 1000*a* and the second magnetic sensor unit 1000*b* are disposed, in the first direction, across a line connecting between the center of gravity of the third magnetic sensor unit 1000*c* and the center of gravity of the fourth magnetic sensor unit 1000*d* (e.g. the y-axis).

Further, the third magnetic sensor unit 1000*c* and the fourth magnetic sensor unit 1000*d* are disposed, in the first direction, between the center of gravity of the first magnetic sensor unit 1000*a* and the center of gravity of the second magnetic sensor unit 1000*b*. The third magnetic sensor unit 1000*c* and the fourth magnetic sensor unit 1000*d* are disposed, in the second direction, across a line connecting the center of gravity of the first magnetic sensor unit 1000*a* and the center of gravity of the second magnetic sensor unit 1000*b* (e.g. the x-axis).

The magnetic field detection device 1 can be manufactured by the following manufacturing method. First, the bridge circuit and the electric circuit forming the first magnetic sensor unit 1000*a* are produced by making wire connections to a printed circuit board. The magnetic sensor units 1000*b* to 1000*d* are produced in the same manner. Subsequently the magnetic sensor units 1000*a* to 1000*d* are fixed to a holding table. The holding table should be non-magnetic, and made of material such as resin and aluminum. In this case, the first magnetic sensor unit 1000*a* and the second magnetic sensor unit 1000*b* are fixed, in the second direction, such that they are disposed between the center of gravity of the third magnetic sensor unit 1000*c* and the center of gravity of the fourth magnetic sensor unit 1000*d*. Further, the first magnetic sensor unit 1000*a* and the second magnetic sensor unit 1000*b* are fixed, in the first direction, such that they are disposed across a line connecting the center of gravity of the third magnetic sensor unit 1000*c* and the center of gravity of the fourth magnetic sensor unit 1000*d* (e.g. the y-axis).

Embodiment 2

Figure 9:
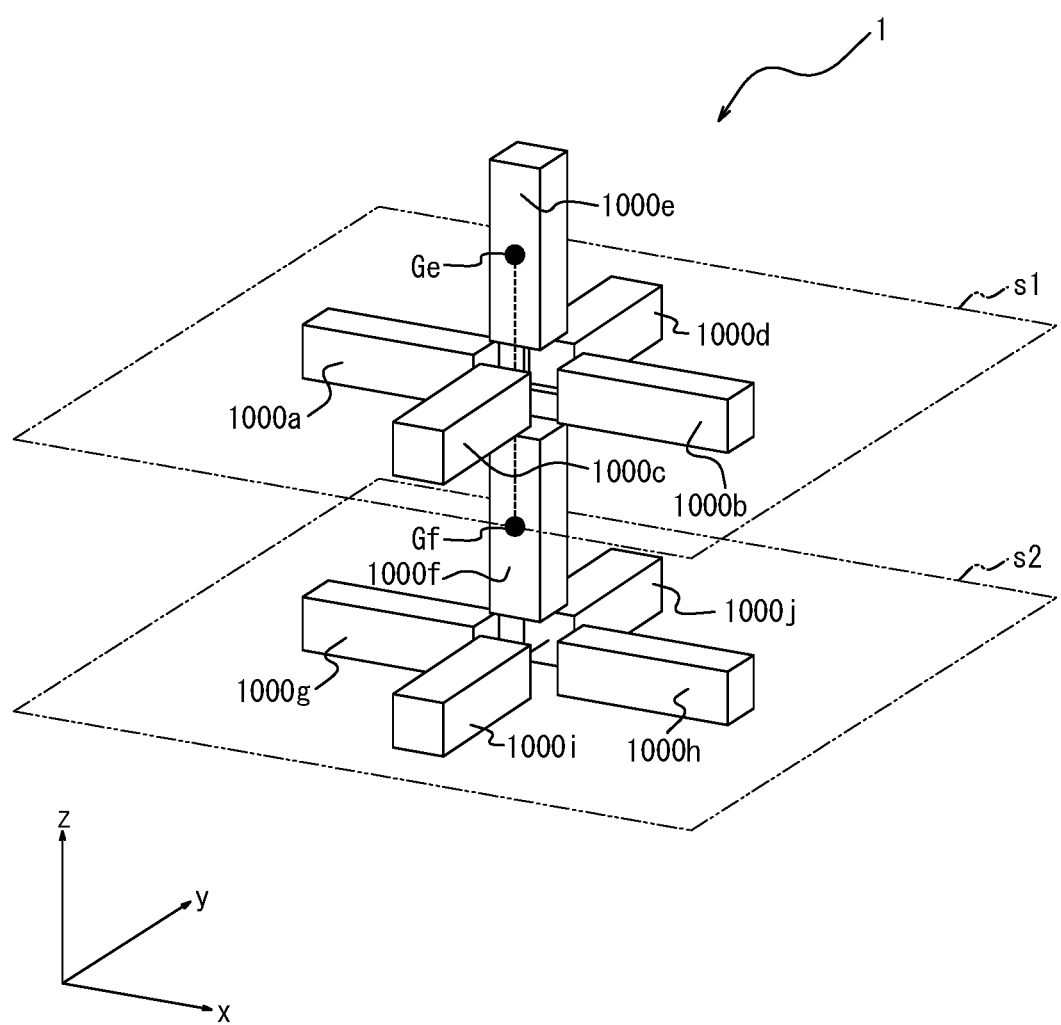
FIG. 9 is a diagram illustrating an example of a configuration of the magnetic field detection device.

FIG. 9 is a diagram illustrating a configuration example of a magnetic field detection device 1 according to Embodiment 2. The magnetic field detection device 1 includes a plurality of magnetic sensor units 1000. In the present embodiment, the magnetic field detection device 1 includes a first magnetic sensor unit 1000*a* to a tenth magnetic sensor unit 1000*j*. The configuration of the magnetic sensor unit 1000 included in the magnetic field detection device 1 according to the present embodiment is the same as that of Embodiment 1. Further, the magnetic field detection device 1 according to the present embodiment can be produced by the manufacturing method similar to that of Embodiment 1. Thus, description of a configuration of the magnetic sensor unit 1000 according to the present embodiment and a production method of the magnetic field detection device 1 will be omitted.

In the magnetic field detection device 1 according to the present embodiment, in addition to the first direction (e.g. the x-axis direction) and the second direction (e.g. the y-axis direction), the magnetic sensor unit 1000 is disposed in the third direction (e.g. the z-axis direction) orthogonal thereto. FIG. 9 is a perspective view illustrating the magnetic field detection device 1 according to the present embodiment. It is to be noted that the third direction may not be strictly orthogonal to the first direction and to the second direction. That is, the third direction may be substantially orthogonal to the first direction and to the second direction.

In the example in FIG. 9, two xy planes (planes s1 and s2) including the x-axis direction, which is the first direction, and the y-axis direction, which is the second direction, are illustrated. In each of the plane s1 and the plane s2, the magnetic field detection device 1 has the same configuration as that of Embodiment 1. For example, in the plane s2, the seventh magnetic sensor unit 1000*g* and the eighth magnetic sensor unit 1000*h* are disposed side by side so that the sensitive axis directions of the seventh magnetic sensor unit 1000*g* and the eighth magnetic sensor unit 1000*h* are aligned with the x-axis direction. Further, the ninth magnetic sensor unit 1000*i* and the tenth magnetic sensor unit 1000*j* are disposed side by side so that the sensitive axis directions of the ninth magnetic sensor unit 1000*i* and the tenth magnetic sensor unit 1000*j* are aligned with the y-axis direction.

As illustrated in FIG. 9, the magnetic field detection device 1 includes a fifth magnetic sensor unit 1000*e* disposed so that the sensitive axis direction of the fifth magnetic sensor unit 1000*e* coincides with the z-axis direction. In the plane s1, the center of gravity Ge of the fifth magnetic sensor unit 1000*e* projected on the plane s1 is disposed, in the y-axis direction, between the center of gravity of the third magnetic sensor unit 1000*c* and the center of gravity of the fourth magnetic sensor unit 1000*d*. Further, in the plane s1, the center of gravity Ge of the fifth magnetic sensor unit 1000*e* projected on the plane s1 is disposed, in the x-axis direction, between the center of gravity of the first magnetic sensor unit 1000*a* and the center of gravity of the second magnetic sensor unit 1000*b*. The magnetic field detection device 1 includes the fifth magnetic sensor unit 1000*e* that defines the z-axis direction as the sensitive axis, and thus acts as a three axes sensor, enabling wide range of applications.

Further, as illustrated in FIG. 9, the magnetic field detection device 1 includes a sixth magnetic sensor unit 1000*f* disposed so that the sensitive axis direction of the sixth magnetic sensor unit 1000*f* coincides with the z-axis direction. The line connecting between the center of gravity Ge of the fifth magnetic sensor unit 1000*e* and the center of gravity Gf of the sixth magnetic sensor unit 1000*f* has an intersection with the plane s1. In the example in FIG. 9, the center of gravity Gf of the sixth magnetic sensor unit 1000*f* is symmetry with the center of gravity Ge of the fifth magnetic sensor unit 1000*e* with respect to the plane s1. It is to be noted that the magnetic sensor units 1000 disposed side by side in the z-axis direction may be separated by the distance D in the z-axis direction. The distance D may be the same value as that of Embodiment 1.

When the external magnetic field Bx is applied, the magnetic field detection device 1 illustrated in FIG. 9 generates a magnetic field as described below. For example, at the position of the fourth magnetic sensor unit 1000*d*, as described above, the magnetic field generated by the first magnetic sensor unit 1000*a* is cancelled by the magnetic field generated by the second magnetic sensor unit 1000*b*. Further, in the same manner, at the position of the fourth magnetic sensor unit 1000*d*, the magnetic field generated by the fifth magnetic sensor unit 1000*e* is cancelled by the magnetic field generated by the sixth magnetic sensor unit 1000*f*. Further, in the same manner, at the positions of the first magnetic sensor unit 1000*a* to the third magnetic sensor unit 1000*c*, the fifth magnetic sensor unit 1000*e* and the sixth magnetic sensor unit 1000*f*, an influence of the magnetic field generated by the magnetic sensor unit 1000 of the other axis (a different sensitive axis) is cancelled. Further, also at the positions of the seventh magnetic sensor unit 1000*g* to the tenth magnetic sensor unit 1000*j*, except for the sixth magnetic sensor unit 1000*f*, an influence of the magnetic field generated by the magnetic sensor unit 1000 of the other axis is cancelled. That is, an influence of the magnetic field from the other axis is reduced with respect to the first magnetic sensor unit 1000*a* to the tenth magnetic sensor unit 1000*j* included in the magnetic field detection device 1.

It is to be noted that, if an influence of the magnetic field generated by the magnetic sensor unit 1000 of the other axis (a different sensitive axis) is cancelled, in the magnetic field detection device 1 according to the present embodiment, the positions of the magnetic sensor units 1000 may be different from those illustrated in FIG. 9. In the example in FIG. 9, the fifth magnetic sensor unit 1000*e* and the sixth magnetic sensor unit 1000*f* in which the sensitive axis is the z direction are disposed side by side on one axis (e.g. the z-axis) parallel to the z-axis direction. However, the fifth magnetic sensor unit 1000*e* and the sixth magnetic sensor unit 1000*f* may be located at a different position at least in one of the x-axis direction and the y-axis direction. That is, the xy coordinate of the fifth magnetic sensor unit 1000*e* and the xy coordinate of the sixth magnetic sensor unit 1000*f* may be different.

Embodiment 3

Figure 10:
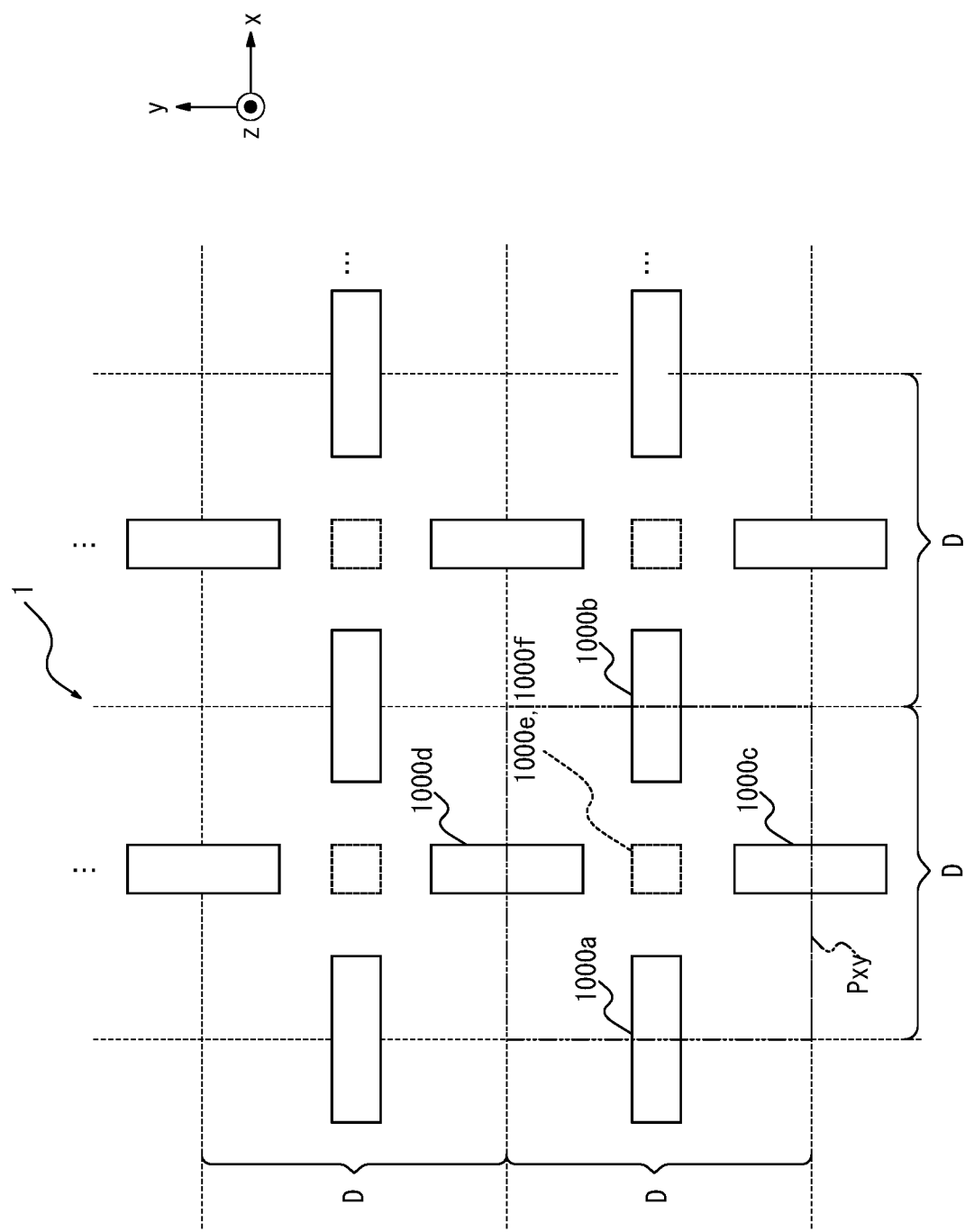
FIG. 10 is a diagram illustrating an example of the configuration of the magnetic field detection device.
Figure 11:
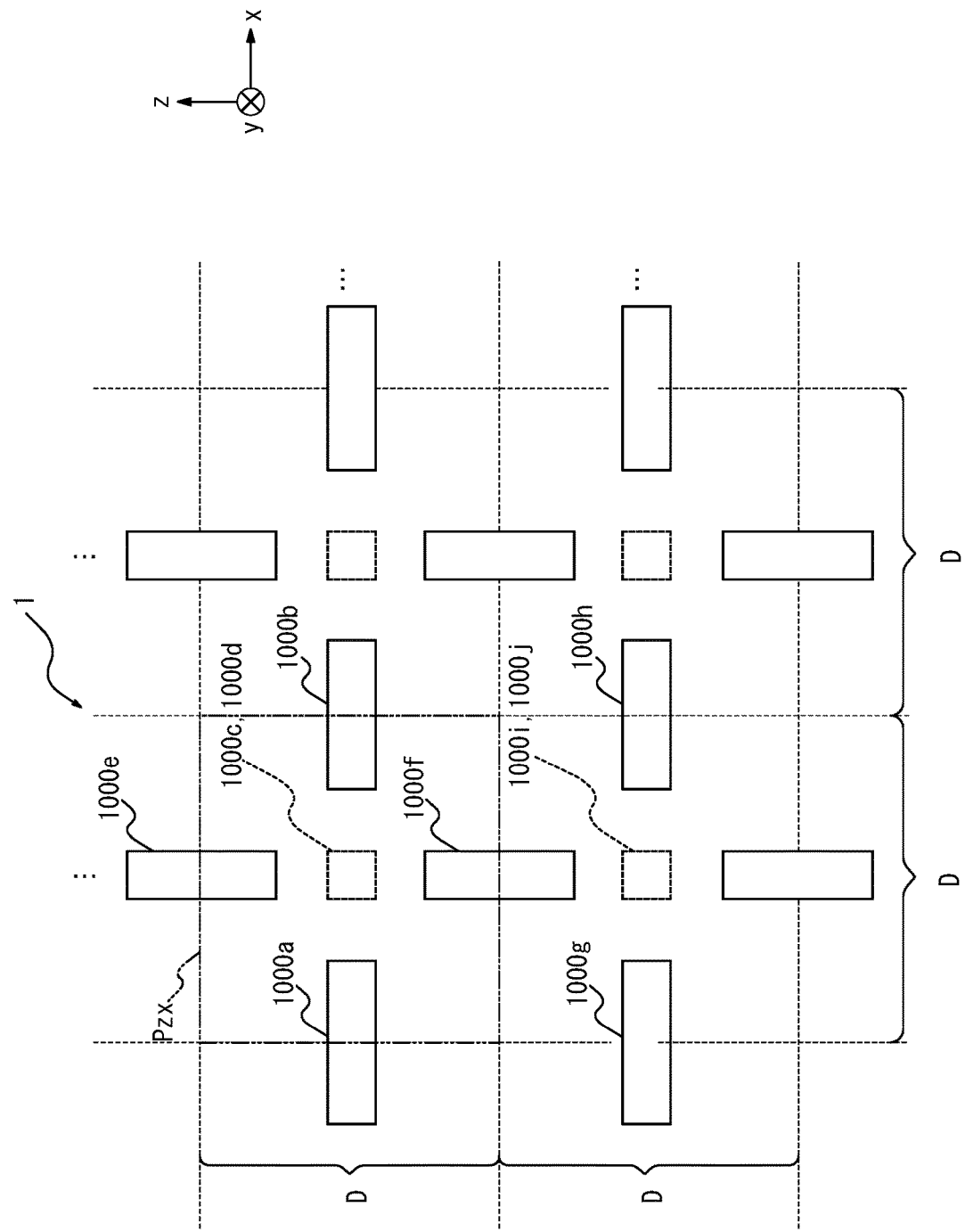
FIG. 11 is a diagram illustrating an example of the configuration of the magnetic field detection device.
Figure 12:
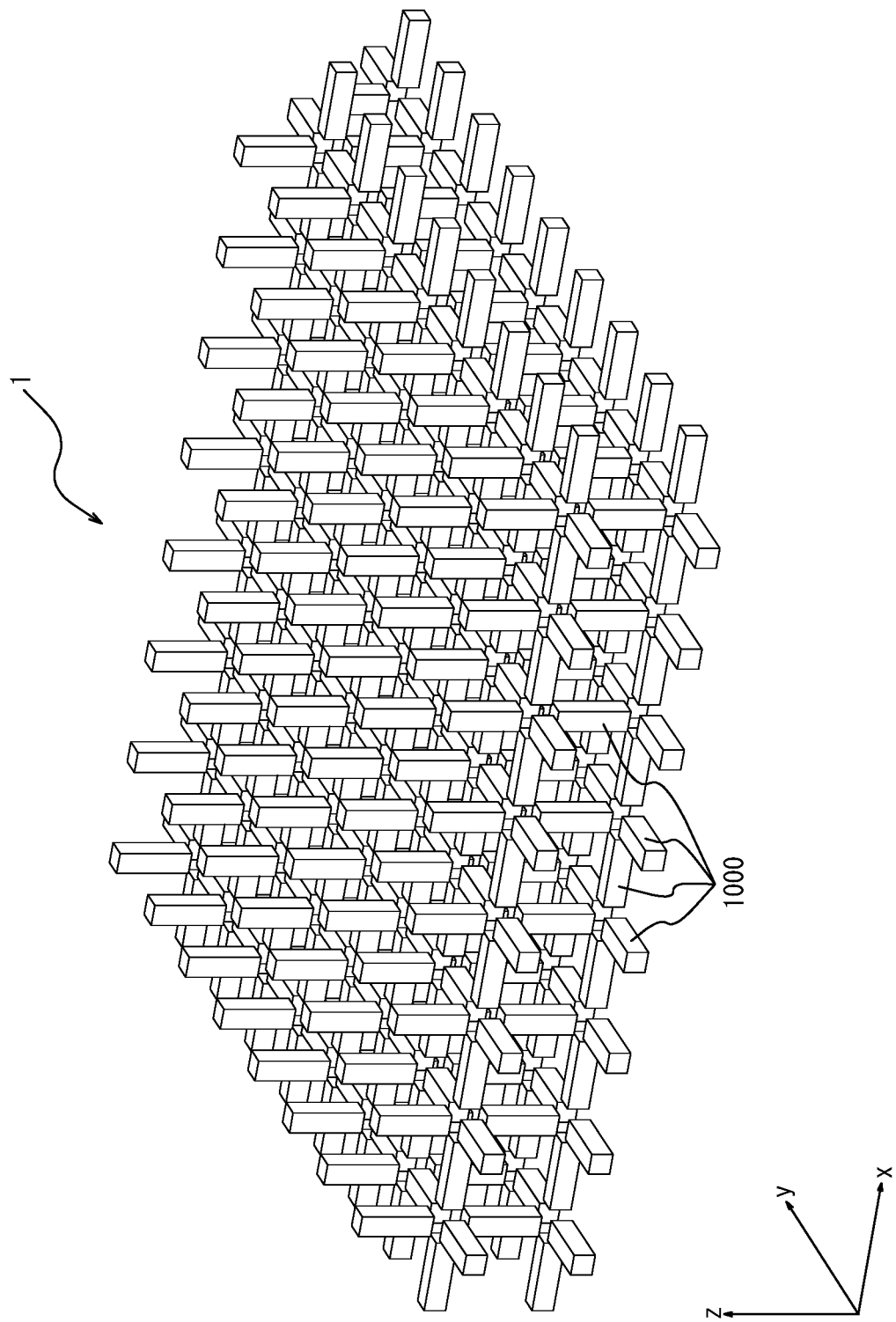
FIG. 12 is a diagram illustrating an example of the configuration of the magnetic field detection device.

FIGS. 10, 11 and 12 are diagrams illustrating a configuration example of a magnetic field detection device 1 according to Embodiment 3. The magnetic field detection device 1 includes a plurality of magnetic sensor units 1000. In the present embodiment, the magnetic field detection device 1 is configured by repeating the disposition according to Embodiment 2. The configuration of the magnetic sensor units 1000 included in the magnetic field detection device 1 according to the present embodiment is the same as that of Embodiment 1. The magnetic field detection device 1 according to the present embodiment can be manufactured by a manufacturing method similar to that of Embodiment 1. Thus, description of a configuration of the magnetic sensor unit 1000 according to the present embodiment and a production method of the magnetic field detection device 1 will be omitted.

FIG. 10 is a cross-sectional view of a xy plane of the magnetic field detection device 1 according to the present embodiment. FIG. 11 is a cross-sectional view of a zx plane of the magnetic field detection device 1 according to the present embodiment. In FIGS. 10 and 11, the magnetic sensor unit 1000 has a square shape. As described above, the magnetic field detection device 1 according to the present embodiment includes a repeated disposition of Embodiment 2. The first magnetic sensor unit 1000*a* to the tenth magnetic sensor unit 1000*j* in FIGS. 10 and 11 are the same as those in FIG. 9.

As illustrated in FIG. 10, in the magnetic field detection device 1 according to the present embodiment, the disposition (the pattern Pxy in FIG. 10) of the first magnetic sensor unit 1000*a*, the second magnetic sensor unit 1000*b*, the third magnetic sensor unit 1000*c* and the fourth magnetic sensor unit 1000*d* are repeated in the xy plane in the x-axis direction and the y-axis direction. The length of the pattern Pxy is the distance D in each of the x-axis direction and the y-axis direction. The value of the distance D may be the same as that of Embodiment 1. In the magnetic field detection device 1 according to the present embodiment, a plurality of magnetic sensor units 1000 is disposed while the translation symmetry of the distance D is maintained in the x-axis direction and the y-axis direction. The translation symmetry means that, after a parallel displacement by a specific distance, the same disposition before the parallel displacement is maintained.

As illustrated in FIG. 11, in the magnetic field detection device 1 according to the present embodiment, disposition of the first magnetic sensor unit 1000*a*, the second magnetic sensor unit 1000*b*, the fifth magnetic sensor unit 1000*e* and the sixth magnetic sensor unit 1000*f* (the pattern Pzx in FIG. 11) are repeated on the zx plane in the z-axis direction and the x-axis direction. The length of the pattern Pzx is the aforementioned distance D in the z-axis direction and the x-axis direction. In the magnetic field detection device 1 according to the present embodiment, a plurality of magnetic sensor units 1000 is disposed while the translation symmetry of the distance D is maintained in the z-axis direction and the x-axis direction.

FIG. 12 is a perspective view illustrating an example of 3D shape of the magnetic field detection device 1 according to the present embodiment. Although repetition on the plane is described by using FIGS. 10 and 11, the magnetic field detection device 1 is disposed while 3D disposition of the first magnetic sensor unit 1000*a* to the sixth magnetic sensor unit 1000*f* (3D shape whose one side is the distance D) maintains translation symmetry. It is to be noted that, strictly speaking, the translation symmetry may not be maintained on the end of the magnetic field detection device 1. In this case, the magnetic field detection device 1 can detect the external magnetic field Bx accurately by not using a detection value of the magnetic sensor unit 1000 located on the end of the magnetic field detection device 1. As described in Embodiment 2, expect for the case where magnetic field detection device is disposed on the end, an influence of the magnetic field generated by the magnetic sensor unit 1000 of the other axis is cancelled at the position of the magnetic sensor unit 1000 forming the magnetic field detection device 1. A spatial distribution of magnetic field from an object to be measured can be obtained after crosstalk is reduced by repeated disposition as described in the present embodiment, It is to be noted that the magnetic field detection device 1 may preferably include a signal processing circuit that calculates difference between detection values of a plurality of magnetic sensor units 1000 of the same sensitive axis direction. Calculation of the difference between detection values allows for removal of environmental magnetic field component (e.g. geomagnetism) commonly included in a plurality of detection values, and as a result, a signal magnetic field of the magnetic sensor unit 1000 in the sensitive axis direction can be detected more accurately.

As aforementioned, the magnetic field detection device 1 is disposed while the 3D disposition of the first magnetic sensor unit 1000*a* to the sixth magnetic sensor unit 1000*f* maintains translation symmetry. Thus, in the magnetic field detection device 1, the magnetic sensor unit 1000 of the same sensitive axis direction is disposed at a position separated from one magnetic sensor unit 1000 by a specific distance (e.g. a distance D) in a specific direction (e.g. z direction). For example, with respect to at least the first magnetic sensor unit 1000$a$, the second magnetic sensor unit 1000$b$, the third magnetic sensor unit 1000$c$ and the fourth magnetic sensor unit 1000$d$, a signal processing circuit calculates a difference of detection values between the magnetic sensor units 1000 different from each other disposed separately by a specific distance in a specific direction. In the example in FIG. 9, the signal processing circuit may calculate a difference of detection values between the first magnetic sensor unit 1000$a$ and the seventh magnetic sensor unit 1000$g$. Further, the signal processing circuit may calculate a difference of detection values between the third magnetic sensor unit 1000$c$ and the ninth magnetic sensor unit 1000$i$. Moreover, the signal processing circuit may calculate a difference of detection values between the fifth magnetic sensor unit 1000$e$ and the sixth magnetic sensor unit 1000$f$. It is to be noted that the signal processing circuit may be a main processor that obtains detection values from each magnetic sensor unit 1000 and controls overall magnetic field detection device 1. The aforementioned specific direction may be the first direction, the second direction and the third direction, but is not limited thereto, and the aforementioned specific distance may be the distance D, but is not limited thereto.

The aforementioned embodiments are provided to illustrate devices and methods for embodying the technical idea, and not to specify the material, the shape, the disposition and the like of the components. That is, various modifications may be made within the technical scope described in the claims.

EXAMPLES

[Magnetic Simulation]

Magnetic field analysis simulation was performed with respect to the following examples and a comparative example by using the finite element method. In the magnetic field analysis simulation, a magnetic layer having an optional shape and magnetic permeability and a conductor through which current flows can be produced on the virtual space of a computer. When a magnetic layer whose shape is defined is divided into small regions each having an optional size, and a magnetic field is applied thereto, a state of magnetization in each of small regions in the magnetic layer can be calculated. Hereinafter the winding axis direction of the canceling magnetic field generator 70, the direction vertical to the thickness of the magnetic layer and the direction vertical to the length direction and the thickness direction are referred to as the "length direction," the "thickness direction" and the "width direction," respectively.

On the virtual space, the winding axis direction is in parallel to the sensitive axis direction. First, on the virtual space, components corresponding to one magnetic sensor 11 were defined. The magnetic layer 210 corresponding to the free layer 21 of the magnetic sensor 11 was set to the length direction 100 μm, the width direction 149 μm, the thickness direction 0.07 μm and the magnetic permeability 2000. Further, the sensitive area 230$a$ corresponding to the pinned layer 23 of the magnetic sensor 11 was set to the length direction 5 μm and the width direction 28 μm. The position of the sensitive area 230 was defined as the center of the magnetic layer 210 viewed from the top. Furthermore, the magnetic layer 300 corresponding to the magnetic concentrator 30 of the magnetic sensor 11 was set to the length direction 5 mm, the width direction 1 mm, the thick direction 10 μm and the magnetic permeability 2000. The clearance between the magnetic layer 210 and the magnetic layer 300 in the sensitive axis direction was set to 5 μm, and the magnetic layer 210 and the magnetic layer 300 were disposed such that their centers of gravity are coincide with each other. Furthermore, the conductor 700 corresponding to the canceling magnetic field generator 70 was formed into a ring shape with a diameter of 6 mm by using a conductive wire element with a diameter of 0.2 mm, and 51 pieces thereof were disposed to obtain 10.2 mm in the length direction.

Hereinafter the "magnetic sensor" means a group as defined by the magnetic simulation described above. In the magnetic simulation, when current 1 μA is applied to the conductor 700 of the magnetic sensor, the following value was obtained as a magnetization $M_0$ of the sensitive area 230.

$$M_0 = 3.698 \times 10^{-4} \text{ [T]}$$

In the following each example and a comparative example, the aforementioned magnetic sensors were disposed on the virtual space, and current is applied to the conductor 700 included in the other magnetic sensor adjacent to a certain magnetic sensor to obtain a magnetization $M_A$ of the magnetic sensor (A represents each magnetic sensor). In this case, the ratio of $M_0$ to $M_A$ corresponds to a signal mixed from the other axis. Thus, the smaller the value of $M_A/M_0$ is, the smaller the influence of the other axis is. The following describes the value of $M_A/M_0$ according to this example is higher than the value of $M_A/M_0$ according to a comparative example.

Example 1

Example 1 corresponds to the case where the distance D is defined to be 20 mm in FIG. 7. In Example 1, a magnetic sensor X1 (corresponding to the first magnetic sensor unit 1000$a$) whose winding axis directs the x-axis direction was disposed on a position separating from the origin on the virtual space by (−10 mm, 0). A magnetic sensor X2 (corresponding to the second magnetic sensor unit 1000$b$) whose winding axis directs the x-axis direction was disposed on a position separating from the origin on the virtual space by (10 mm, 0). A magnetic sensor Y1 (corresponding to the third magnetic sensor unit 1000$c$) whose winding axis directs the y-axis direction was disposed on a position separating from the origin on the virtual space by (0, −10 mm). Further, a magnetic sensor Y2 (corresponding to the fourth magnetic sensor unit 1000$d$) whose winding axis directs the y-axis direction was disposed on a position separating from the origin on the virtual space by (0, 10 mm).

Subsequently a current of 1 μA was applied to the magnetic sensor X1 and the magnetic sensor X2 to obtain the value of the magnetization component $M_{Y1}$ in the Y direction of the magnetic sensor Y1 and the value of the magnetization component $M_{Y2}$ in the Y direction of the magnetic sensor Y2, and the following values were obtained.

$$M_{Y1} = -1.473 \times 10^{-8} \text{ [T]}$$

$$M_{Y2} = 1.464 \times 10^{-8} \text{ [T]}$$

The values of the magnetization $M_{Y1}/M_o$ and of the magnetization $M_{Y2}/M_o$ were calculated and the following values were obtained.

$$M_{Y1}/M_o = -0.0040 [\%]$$

$$M_{Y2}/M_o = 0.0040 [\%]$$

Example 2

Example 2 corresponds to the case where the distance D is 20 mm in FIG. 9. As with Example 1, the distance D is a distance between the magnetic sensor units 1000 adjacent to each other in each axial direction. In Example 2, the magnetic sensor units 1000 disposed side by side in the z-axis direction are separated by the distance D in the z-axis direction. In the example in FIG. 9, the center of gravity Ge is separated from the center of gravity Gf by the distance D. In Example 2, the magnetic sensor X1 (corresponding to the first magnetic sensor unit 1000a) whose winding axis directs the x-axis direction was disposed on the position separated from the origin on the virtual space by (−10 mm, 0.20 mm). The magnetic sensor X2 (corresponding to the second magnetic sensor unit 1000b) whose winding axis directs the x-axis direction was disposed on the position separated from the origin on the virtual space by (10 mm, 0.20 mm). The magnetic sensor Y1 (corresponding to the third magnetic sensor unit 1000c) whose winding axis directs the y-axis direction was disposed on the position separated from the origin on the virtual space by (0, −10 mm, 20 mm). The magnetic sensor Y2 (corresponding to the fourth magnetic sensor unit 1000d) whose winding axis directs the y-axis direction was disposed on the position separated from the origin on the virtual space by (0, 10 mm, 20 mm). The magnetic sensor Z1 (corresponding to the fifth magnetic sensor unit 1000e) whose winding axis directs the z-axis direction was disposed on the position separated from the origin on the virtual space by (0, 0, 30 mm). The magnetic sensor Z2 (corresponding to the sixth magnetic sensor unit 1000f) whose winding axis directs the z-axis direction was disposed on the position separated from the origin on the virtual space by (0, 0, 10 mm). The magnetic sensor X3 (corresponding to the seventh magnetic sensor unit 1000g) whose winding axis directs the x-axis direction was disposed on the position separated from the origin on the virtual space by (−10 mm, 0, 0). The magnetic sensor X4 (corresponding to the eighth magnetic sensor unit 1000h) whose winding axis directs the x-axis direction was disposed on the position separated from the origin on the virtual space by (10 mm, 0, 0). The magnetic sensor Y3 (corresponding to the ninth magnetic sensor unit 1000i) whose winding axis directs the y-axis direction was disposed on the position separated from the origin on the virtual space by (0, −10 mm, 0). Further, the magnetic sensor Y4 (corresponding to the tenth magnetic sensor unit 1000j) whose winding axis directs the y-axis direction was disposed on the position separated from the origin on the virtual space by (0, 10 mm, 0).

Subsequently the magnetization components $M_{Y1}$ to $M_{Y4}$ in the Y direction of the magnetic sensors Y1 to Y4 and the magnetization components $M_{Z1}$ and $M_{Z2}$ in the Z direction of Z1 and Z2 were obtained by applying current of 1 µA to the magnetic sensors X1 to X4, and the following values were obtained.

$M_{Y1}$=1.448×10$^{-8}$ [T]

$M_{Y2}$=−1.445×10$^{-8}$ [T]

$M_{Y3}$=1.449×10$^{-8}$ [T]

$M_{Y4}$=−1.456×10$^{-8}$ [T]

$M_{Z1}$=−4.175×10$^{-10}$ [T]

$M_{Z2}$=−5.283×10$^{-12}$ [T].

The values of magnetizations $M_{Y1}$ to $_{Y4}/M_O$ and $M_{Z1,Z2}M_O$ were calculated and the following values were obtained.

$M_{Y1}/M_O$=0.0039%

$M_{Y2}/M_O$=−0.0039%

$M_{Y3}/M_O$=0.0039%

$M_{Y4}/M_O$=−0.0039%

$M_{Z1}/M_O$=0.00011%

$M_{Z2}/M_O$=−0.0000014%

Comparative Example 1

Comparative example 1 corresponds to the case where, in FIG. 7, the distance D is defined as 20 mm and the first magnetic sensor unit 1000a and the third magnetic sensor unit 1000c are removed. In the comparative example 1, the magnetic sensor X2 whose winding axis directs the x-axis direction was disposed on the position separated from the origin on the virtual space by (10 mm, 0). Further, the magnetic sensor Y2 whose winding axis directs the y-axis direction was disposed on the position separated from the origin on the virtual space by (0, 10 mm).

Subsequently, the value of the magnetization component $M_{Y2}$ in the Y direction of the magnetic sensor Y2 was obtained by applying the current of 1 µA to the magnetic sensor X2, and the following value was obtained.

$M_{Y2}$=−8.075×10$^{-6}$ [T]

The magnetization $M_{Y2}/M_O$ was calculated and the following value was obtained.

$M_{Y2}/M_O$=−2.18[%]

[Comparison of Simulation Results]

In the examples and a comparative example of the magnetic simulation, when the sensor whose winding axis directs the X direction was driven, the ratio of $M_O$ to $M_A$ of the sensors whose winding axis directs the Y-direction and the Z-direction were compared. That is, the crosstalk from the other axis was evaluated through comparison of the magnetic susceptibilities of the direction that is different from the winding axis of the conductor 700. The smaller the $M_A/M_O$) is, the smaller the crosstalk is. The result of the examples and a comparative example reveals that it is obvious that the examples have smaller $M_A/M_O$) compared to the comparative example. This effect is obtained because, when disposed as in the case of examples, the magnetic field generated from each magnetic sensor unit and the other axis component cancel to each other.

Consequently, it was found that, compared to the comparative example, the examples have more effect of reducing a crosstalk of signal from the magnetic sensor of the other axis.

Other Embodiments

In the magnetic field detection device 1 according to the aforementioned embodiment, a plurality of magnetic sensor units 1000 is disposed repeatedly at intervals of the distance D in the x-axis direction and the y-axis direction. That is, in the aforementioned embodiment, the sensor units are disposed repeatedly by the translation symmetry. Here, as the other embodiment, translation symmetry may not be satisfied at least a part of the configuration in which the magnetic sensor units 1000 are disposed in an array. For the part where the translation symmetry is not satisfied, for example, a plurality of magnetic sensor units 1000 satisfy the following disposition conditions in a plane that includes two directions. For example, suppose that the first magnetic sensor unit 1000a, the second magnetic sensor unit 1000b, the third magnetic sensor unit 1000c and the fourth magnetic sensor unit 1000d are included in a plane that includes the x-axis direction and the y-axis direction (an xy plane) of the part where the translation symmetry is not satisfied. In this case, the first magnetic sensor unit 1000a and the second magnetic sensor unit 1000b are disposed side by side so that the sensitive axis direction of the first magnetic sensor unit 1000a and the second magnetic sensor unit 1000b are oriented in the first direction (x-axis direction). The third magnetic sensor unit 1000c and the fourth magnetic sensor unit 1000d are disposed side by side so that the sensitive axis direction of the third magnetic sensor unit 1000c and the fourth magnetic sensor unit 1000d are oriented in the second direction (y-axis direction) substantially orthogonal to the first direction. The first magnetic sensor unit 1000a and the second magnetic sensor unit 1000b are disposed between a plane that includes the center of gravity of the third magnetic sensor unit 1000c and defines the second direction as a normal direction and a plane that includes the center of gravity of the fourth magnetic sensor unit 1000d and defines the second direction as a normal direction. Further, the third magnetic sensor unit 1000c and the fourth magnetic sensor unit 1000d are disposed between a plane that includes the center of gravity of the first magnetic sensor unit 1000a and defines the first direction as a normal direction and a plane that includes the center of gravity of the second magnetic sensor unit 1000b and defines the first direction as a normal direction. It should be noted the same disposition conditions are applied to the other plane (e.g. a zx plane).

That is, even if there is a displacement between a pair of magnetic sensor units 1000 in the same sensitive axis direction, a part of the magnetic field component generated by the magnetic sensor unit 1000 having a different sensitive axis direction (a magnetic field component generated from the other axis) is cancelled as long as the aforementioned disposition conditions are satisfied. Thus, the detection accuracy of the magnetic field detection device 1 can be improved. Therefore, it is not always necessary for the magnetic sensor units 1000 to be disposed with regularity as illustrated in FIGS. 10 to 12. For example, the description of "the magnetic sensor units 1000 are disposed so that the sensitive axis direction of the magnetic sensor units are oriented in the first direction" means that it is not necessary for each sensitive axis of magnetic sensor units 1000 to be disposed side by side on the same line, and each sensitive axis thereof may be disposed in parallel to each other.

Figure 13:
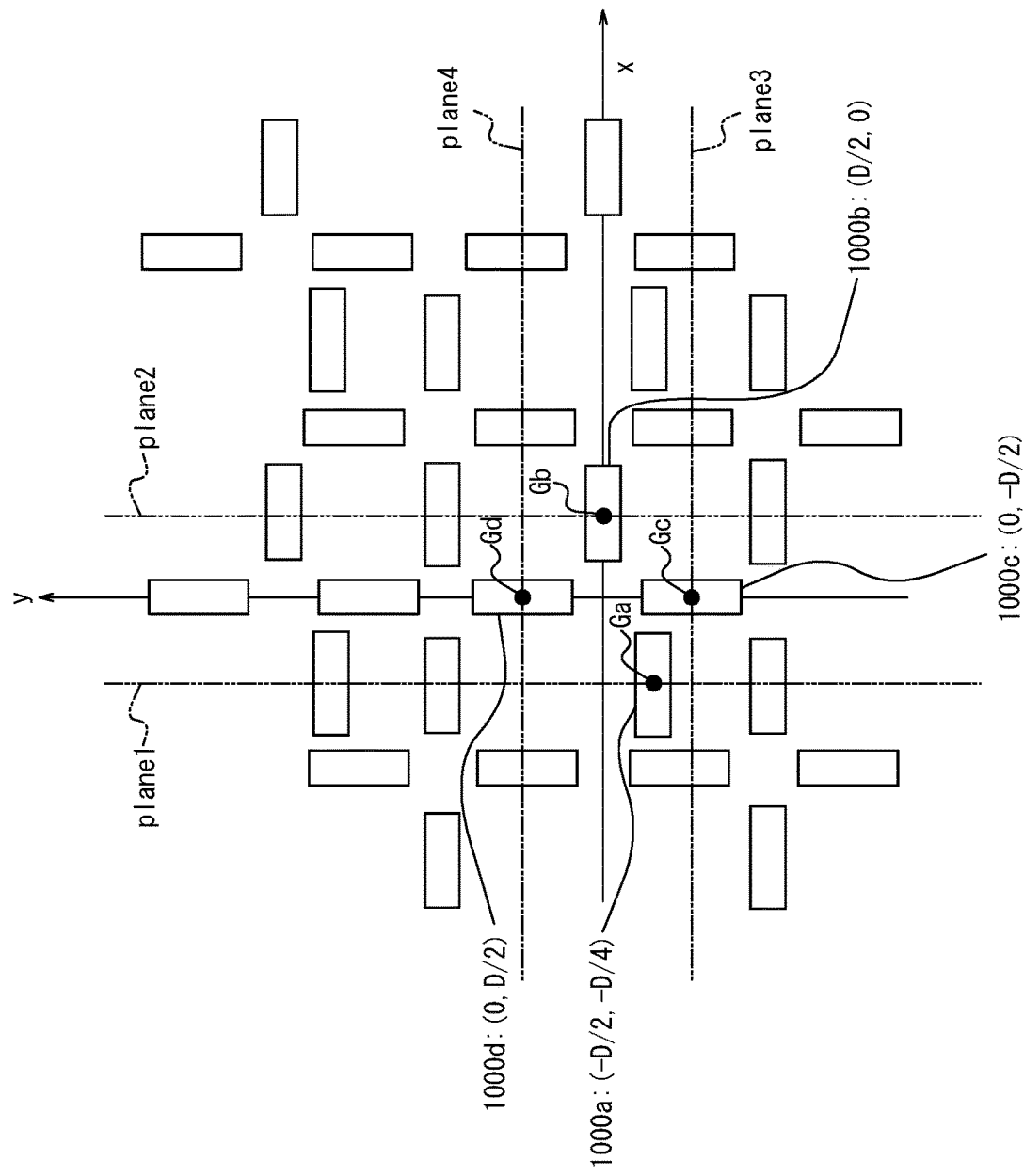
FIG. 13 is a diagram illustrating an example of configuration of the magnetic field detection device.

FIG. 13 illustrates an example that satisfies the disposition conditions of the aforementioned xy plane. As illustrated in FIG. 13, the first magnetic sensor unit 1000a and the second magnetic sensor unit 1000b are not symmetric with respect to the axis (axis parallel to the y-axis) connecting the center of gravity of the third magnetic sensor unit 1000c and the center of gravity of the fourth magnetic sensor unit 1000d. That is, the first magnetic sensor unit 1000a and the second magnetic sensor unit 1000b are displaced in the y-axis direction. With respect to the repeated disposition illustrated in FIG. 13, the position after moving from the position of the coordinate (0, 0) to (2D, 0) or (0, 2D) will be the same position as (0, 0). However, with respect to the repeated disposition illustrated in FIG. 13, the position after moving from the position of the coordinate (0, 0) to (2D, 0) or (0, 2D) will not be the same position as (0, 0). Even in this case, it is also possible to obtain a spatial distribution of the magnetic field from an object to be measured after crosstalk is reduced.

Figure 14:
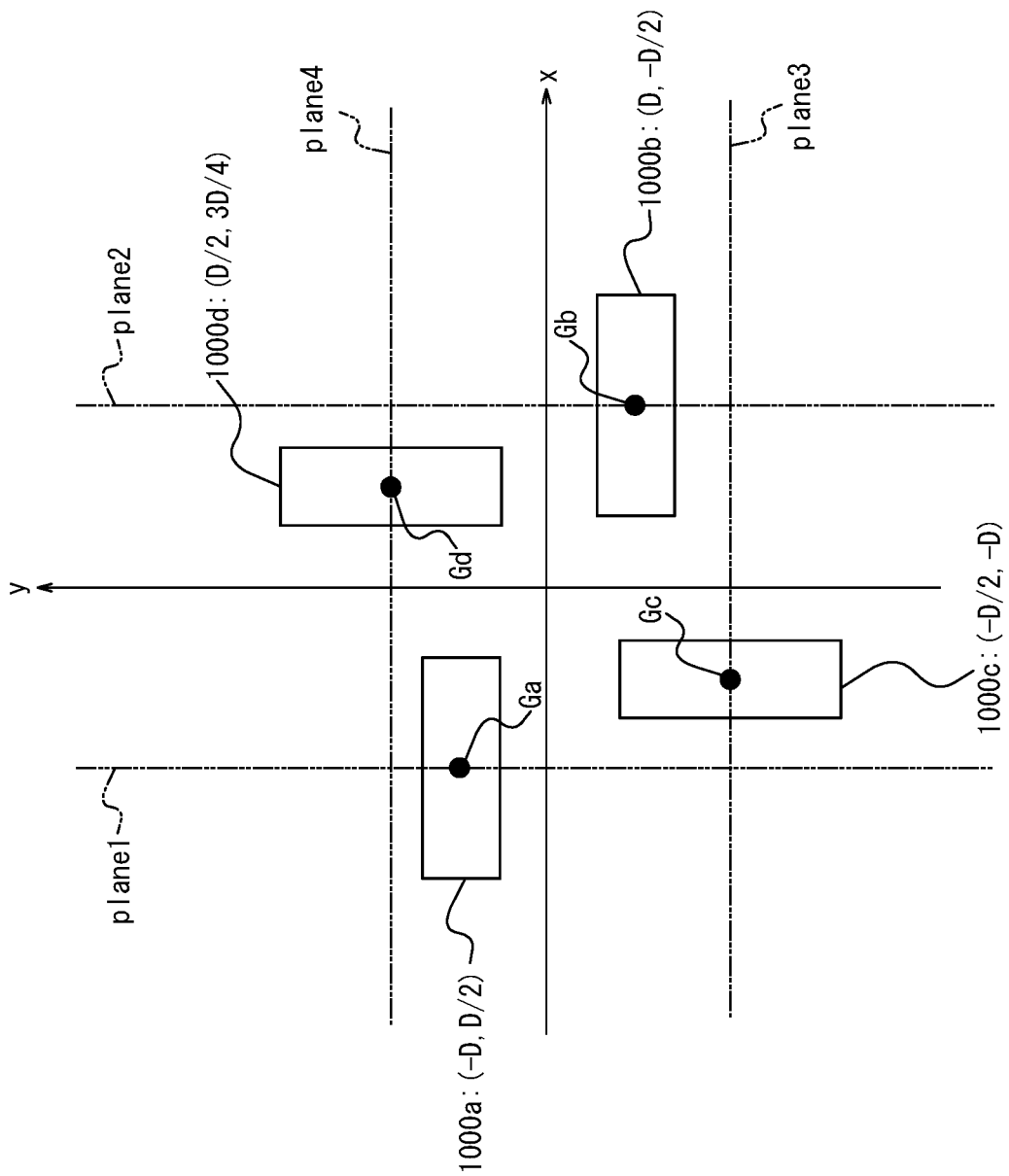
FIG. 14 is a diagram illustrating an example of configuration of the magnetic field detection device.

FIG. 14 illustrates another example that satisfies disposition conditions with respect to the aforementioned xy plane. In the example in FIG. 14, not only the first magnetic sensor unit 1000a and the second magnetic sensor unit 1000b but also the third magnetic sensor unit 1000c and the fourth magnetic sensor unit 1000d are displaced to each other. Even in this case, it is also possible to obtain a spatial distribution of magnetic field from an object to be measured after crosstalk is reduced.

Figure 15:
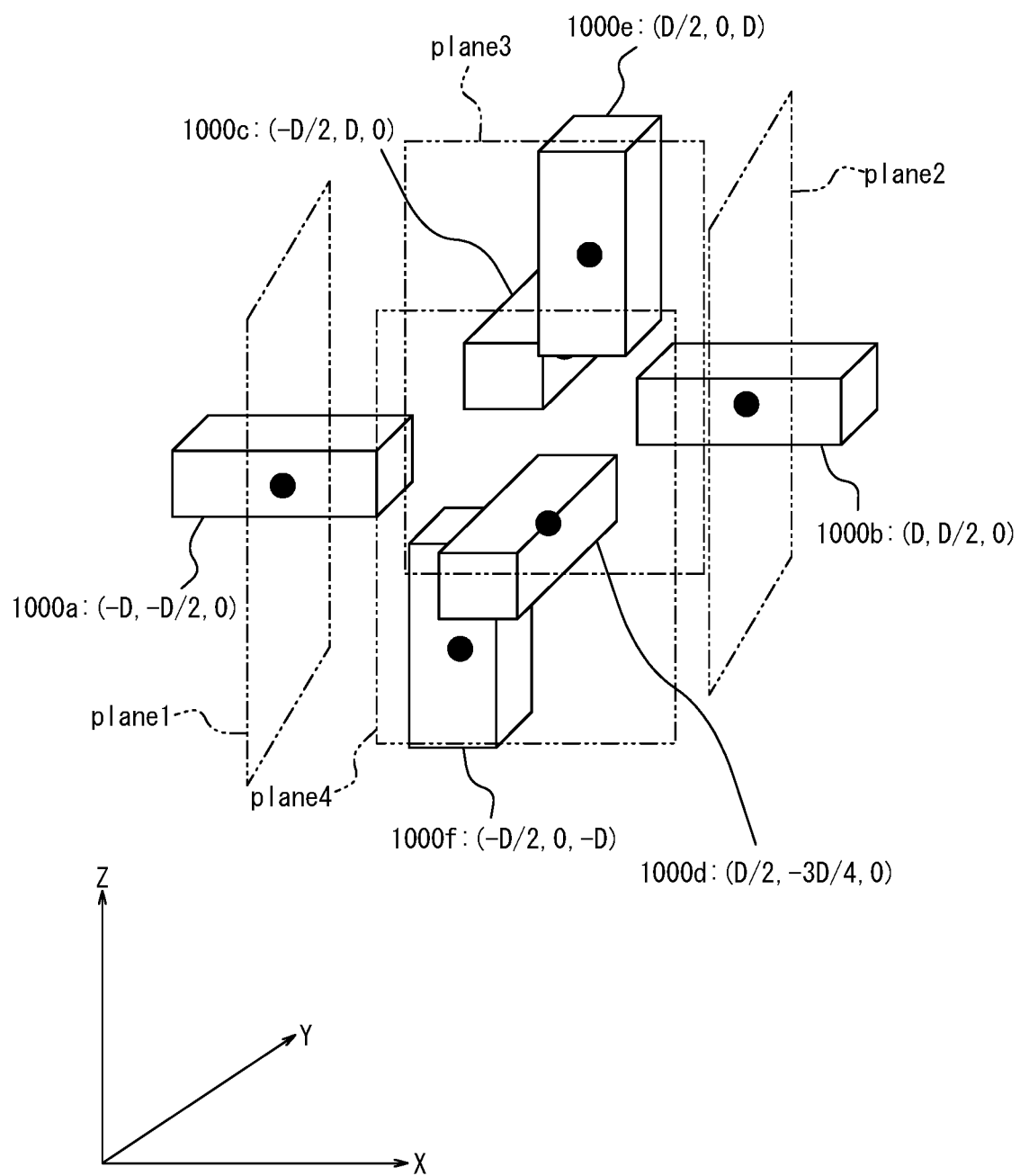
FIG. 15 is a diagram illustrating an example of configuration of the magnetic field detection device.

FIG. 15 illustrates, in addition to the four magnetic sensor units 1000 in FIG. 14, an example where the fifth magnetic sensor unit 1000e and the sixth magnetic sensor unit 1000f displaced in the z-axis direction are disposed. In the example in FIG. 15, the center of gravity of the fifth magnetic sensor unit 1000e is disposed between a plane 1 that includes the center of gravity of the first magnetic sensor unit 1000a and defines the first direction (x-axis direction) as a normal direction and a plane 2 that includes the center of gravity of the second magnetic sensor unit 1000b and defines the first direction as a normal direction, and further is disposed between a plane 3 that includes the center of gravity of the third magnetic sensor unit 1000c and defines the second direction (y-axis direction) as a normal direction and a plane 4 that includes the center of gravity of the fourth magnetic sensor unit 1000d and defines the second direction as a normal direction. Further, the center of gravity of the sixth magnetic sensor unit 1000f is disposed between the plane 1 that includes the center of gravity of the first magnetic sensor unit 1000a and defines the first direction as a normal direction and the plane 2 that includes the center of gravity of the second magnetic sensor unit 1000b and defines the first direction as a normal direction and further is disposed between a plane 3 that includes the center of gravity of the third magnetic sensor unit 1000c and defines the second direction as a normal direction and a plane 4 that includes the center of gravity of the fourth magnetic sensor unit 1000d and defines the second direction as a normal direction. The first magnetic sensor unit 1000a, the second magnetic sensor unit 1000b, the third magnetic sensor unit 1000c and the fourth magnetic sensor unit 1000d are disposed between a plane 5 that includes the center of gravity of the fifth magnetic sensor unit 1000e and defines the third direction (z-axis direction) as a normal direction and a plane 6 that includes the center of gravity of the sixth magnetic sensor unit 1000f and defines the third direction as a normal direction. Thus, the example in FIG. 15 satisfies, in addition to the disposition conditions of the xy plane, the disposition conditions of the zx plane and the yz plane. In this case, a spatial distribution of the magnetic field from an object to be measured can be obtained after a crosstalk is reduced.

Moreover, as a further embodiment, a part of the components provided in the aforementioned embodiments may be omitted from the magnetic sensor unit 1000. For example, the canceling magnetic field generator 70 and the electric circuit that generates cancel current may be omitted from the magnetic sensor unit 1000. Moreover, the magnetic concentrator 30 may be omitted from the magnetic sensor unit 1000. Even if a part of the components provided in the aforementioned embodiments are omitted from the magnetic sensor unit 1000, an influence of the magnetic field from the other axis direction is reduced as far as the aforementioned disposition conditions are satisfied between each of the magnetic sensor units 1000. Thus detection accuracy of the magnetic field detection device 1 can be increased. When the magnetic sensor unit does not include the canceling magnetic field generator, the center of gravity in the sensitive area of the magnetic sensor unit is the "center of gravity of the magnetic sensor unit." When the magnetic sensor unit has a plurality of sensitive areas, the center of gravity of the magnetic sensor unit is the center of gravity of all of the sensitive areas.

The invention claimed is:

1. A magnetic field detection device comprising a plurality of magnetic sensor units, each having a magnetic sensor that includes a substrate and an element, a canceling magnetic field generator and an electric circuit, at least a part of the magnetic sensor being located inside an envelope surface of the canceling magnetic field generator, wherein
   the element outputs a detection value corresponding to an input magnetic field component in a sensitive axis direction;
   the canceling magnetic field generator is formed by winding a conductor around a direction substantially parallel to the sensitive axis as a winding axis;
   the electric circuit applies a feedback current based on the detection value to the canceling magnetic field generator to cause the canceling magnetic field generator to generate a canceling magnetic field that reduces the input magnetic field;
   the magnetic sensor units include at least a first magnetic sensor unit, a second magnetic sensor unit, a third magnetic sensor unit and a fourth magnetic sensor unit;
   the first magnetic sensor unit and the second magnetic sensor unit are disposed side by side so that the sensitive axis directions of the first magnetic sensor unit and the second magnetic sensor unit are oriented in a first direction;
   the third magnetic sensor unit and the fourth magnetic sensor unit are disposed side by side so that the sensitive axis directions of the third magnetic sensor unit and the fourth magnetic sensor unit are oriented in a second direction substantially orthogonal to the first direction;
   the first magnetic sensor unit and the second magnetic sensor unit are disposed between a plane that includes a center of gravity of the third magnetic sensor unit and defines the second direction as a normal direction and a plane that includes a center of gravity of the fourth magnetic sensor unit and defines the second direction as a normal direction;
   the third magnetic sensor unit and the fourth magnetic sensor unit are disposed between a plane that includes a center of gravity of the first magnetic sensor unit and defines the first direction as a normal direction and a plane that includes a center of gravity of the second magnetic sensor unit and defines the first direction as a normal direction;
   the magnetic sensor units include a fifth magnetic sensor unit disposed so that the sensitive axis direction of the fifth magnetic sensor unit coincides with a third direction substantially orthogonal to the first direction and to the second direction; and
   a center of gravity of the fifth magnetic sensor unit is disposed between a plane that includes a center of gravity of the first magnetic sensor unit and defines the first direction as a normal direction and a plane that includes a center of gravity of the second magnetic sensor unit and defines the first direction as a normal direction, and is disposed between a plane that includes a center of gravity of the third magnetic sensor unit and defines the second direction as a normal direction and a plane that includes a center of gravity of the fourth magnetic sensor unit and defines the second direction as a normal direction.

2. The magnetic field detection device according to claim 1, wherein
   the magnetic sensor units include a sixth magnetic sensor unit disposed so that the sensitive axis direction of the sixth magnetic sensor unit coincides with the third direction;
   a center of gravity of the sixth magnetic sensor unit is disposed between a plane that includes a center of gravity of the first magnetic sensor unit and defines the first direction as a normal direction and a plane that includes a center of gravity of the second magnetic sensor unit and defines the first direction as a normal direction, and is disposed between a plane that includes a center of gravity of the third magnetic sensor unit and defines the second direction as a normal direction and a plane that includes a center of gravity of the fourth magnetic sensor unit and defines the second direction as a normal direction; and
   the first magnetic sensor unit, the second magnetic sensor unit, the third magnetic sensor unit and the fourth magnetic sensor unit are disposed between a plane that includes a center of gravity of the fifth magnetic sensor unit and defines the third direction as a normal direction and a plane that includes a center of gravity of the sixth magnetic sensor unit and defines the third direction as a normal direction.

3. The magnetic field detection device according to claim 1, comprising a signal processing circuit configured to calculate a difference between the detection values of the magnetic sensor units in a same sensitive axis direction.

4. The magnetic field detection device according to claim 3, wherein the signal processing circuit calculates a difference between each of the detection values of at least one of a first magnetic sensor unit, a second magnetic sensor unit, a third magnetic sensor unit and a fourth magnetic sensor unit and a detection value of a magnetic sensor unit disposed respectively at a specific distance in a specific direction.

5. The magnetic field detection device according to claim 1, wherein the first magnetic sensor unit, the second magnetic sensor unit, the third magnetic sensor unit and the fourth magnetic sensor unit are disposed repeatedly in the first direction and the second direction.

6. The magnetic field detection device according to claim 1, wherein the electric circuit has a function of adjusting an offset value of the feedback current.

7. The magnetic field detection device according to claim 1, wherein the magnetic sensor includes a magnetic concentrator configured to concentrate an input magnetic field to the element.

8. The magnetic field detection device according to claim 7, wherein
   the magnetic concentrator is disposed on both sides of the element in a direction parallel to the sensitive axis; and
   a first length connecting both ends in the sensitive axis direction, a second length that is a maximum length in a direction vertical to a principal surface of the substrate and a third length that is a length connecting both ends in a direction vertical to the sensitive axis direction and the direction vertical to the principal surface of the substrate satisfy the second length<the third length<the first length.

9. The magnetic field detection device according to claim 7, wherein the magnetic concentrator includes a first soft magnetic layer formed on the substrate and a second soft magnetic layer being in directly contact with the first soft magnetic layer.

10. The magnetic field detection device according to claim 7, wherein the magnetic sensor unit includes the magnetic concentrator inside an envelope surface of a canceling magnetic field generator.

11. The magnetic field detection device according to claim 1, wherein the element is composed of a laminated layer of a free layer, a non-magnetic layer and a pinned layer.

12. The magnetic field detection device according to claim 11, wherein,
in the element, the free layer, the non-magnetic layer and the pinned layer are laminated in this order; and
an area of a surface of the free layer parallel to a principal surface of the substrate is larger than an area of a surface of the pinned layer parallel to the principal surface of the substrate.

13. The magnetic field detection device according to claim 11, wherein
the magnetic sensor includes the elements; and
the elements are disposed side by side in a direction vertical to the sensitive axis direction of the magnetic sensor and are electrically connected in series.

14. The magnetic field detection device according to claim 11, wherein
the magnetic concentrator includes a first soft magnetic layer formed on the substrate and a second soft magnetic layer being in directly contact with the first soft magnetic layer, and
a thickness of the free layer, a thickness of the first soft magnetic layer and a thickness of the second soft magnetic layer increase in this order.

15. The magnetic field detection device according to claim 11, wherein
the magnetic sensor includes a magnetic concentrator configured to concentrate an input magnetic field to the element, and
a length of the free layer in the sensitive axis direction is longer than a length of a region sandwiched between the magnetic concentrators disposed on both sides of the element.

\* \* \* \* \*